(12) United States Patent
Kim et al.

(10) Patent No.: US 11,737,302 B2
(45) Date of Patent: Aug. 22, 2023

(54) DISPLAY DEVICE AND METHOD OF MANUFACTURING THE SAME

(71) Applicant: LG Display Co., Ltd., Seoul (KR)

(72) Inventors: Jae-Hyeon Kim, Paju-si (KR); Seok-Hyun Kim, Seoul (KR); Kwan-Soo Kim, Seoul (KR); Young-Nam Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 168 days.

(21) Appl. No.: 17/137,139

(22) Filed: Dec. 29, 2020

(65) Prior Publication Data

US 2021/0202880 A1 Jul. 1, 2021

(30) Foreign Application Priority Data

Dec. 31, 2019 (KR) .......................... 10-2019-0180194

(51) Int. Cl.
| | |
|---|---|
| *H10K 50/81* | (2023.01) |
| *H10K 50/82* | (2023.01) |
| *H10K 50/17* | (2023.01) |
| *H10K 50/844* | (2023.01) |
| *H10K 59/65* | (2023.01) |
| *H10K 59/122* | (2023.01) |
| *H10K 71/00* | (2023.01) |
| *H10K 85/20* | (2023.01) |

(52) U.S. Cl.
CPC ........... *H10K 50/81* (2023.02); *H10K 50/171* (2023.02); *H10K 50/82* (2023.02); *H10K 50/844* (2023.02); *H10K 59/122* (2023.02); *H10K 59/65* (2023.02); *H10K 71/00* (2023.02); *H10K 85/211* (2023.02)

(58) Field of Classification Search
None
See application file for complete search history.

(56) References Cited

U.S. PATENT DOCUMENTS

| | | | | |
|---|---|---|---|---|
| 2018/0006106 | A1* | 1/2018 | Oh | ...................... H01L 27/3262 |
| 2019/0102018 | A1* | 4/2019 | Qin | ...................... G06F 3/04144 |
| 2020/0035762 | A1* | 1/2020 | Kim | ...................... H01L 27/323 |
| 2020/0227673 | A1* | 7/2020 | Chang | ................... H01L 51/001 |
| 2021/0399265 | A1* | 12/2021 | Wang | ..................... H10K 71/00 |

FOREIGN PATENT DOCUMENTS

| | | |
|---|---|---|
| KR | 10-2019-0030798 A | 3/2019 |
| KR | 10-2019-0056473 A | 5/2019 |

* cited by examiner

*Primary Examiner* — Michelle Mandala
(74) *Attorney, Agent, or Firm* — Seed IP Law Group LLP

(57) ABSTRACT

The present disclosure relates to a display device, and more particularly, to a high-performance display device by which high transmittance is secured and efficiency is enhanced in a manner of using a mixture of an organic matter and an alkaline earth metal as a cathode and facilitating patterning.

14 Claims, 18 Drawing Sheets

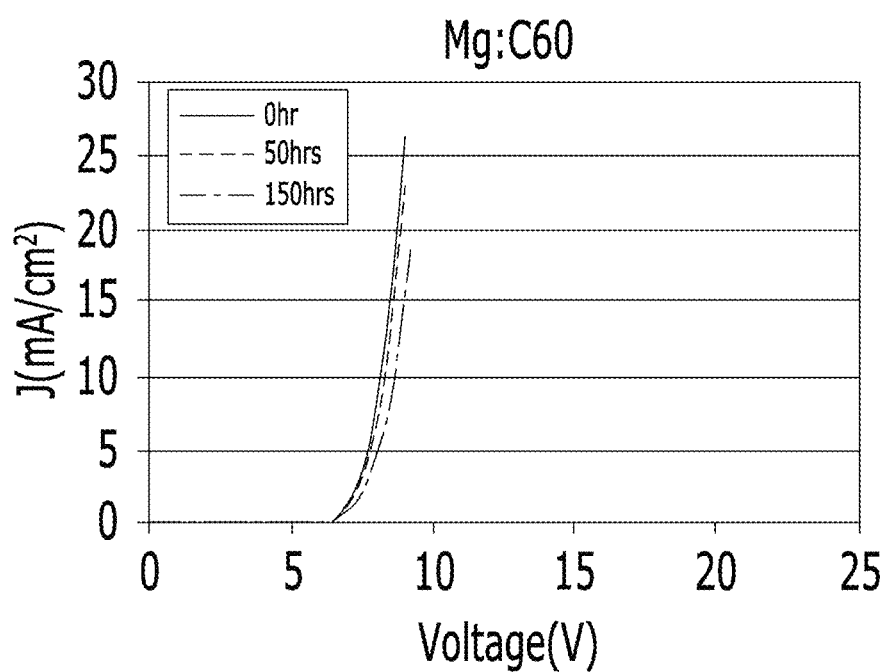

FIG. 15A

| SNx (203) |
|---|
| PCL (202) |
| SNx (201) |
| CPL (170) |
| 40a |
| EL (34) |
| EL |
| Anode (111) |

FIG. 15B

| SNx (203) |
|---|
| PCL (202) |
| SNx (201) |
| CPL (170) |
| 40b |
| EL (134) |
| EL |
| Anode (111) |

FIG. 15C

| SNx (203) |
|---|
| PCL (202) |
| SNx (201) |
| CPL (170) |
| 140 |
| EL (134) |
| EL |
| Anode (111) |

DISPLAY DEVICE AND METHOD OF MANUFACTURING THE SAME

CROSS-REFERENCE TO RELATED APPLICATION(S)

This application claims the benefit of Korean Patent Application No. 10-2019-180194, filed Dec. 31, 2019, which is hereby incorporated by reference as if fully set forth herein.

BACKGROUND

Technical Field

The present disclosure relates to a display device, and more particularly, to a display device and method for manufacturing the same. Although the present disclosure is suitable for a wide scope of applications, it is particularly suitable for securing high transmittance and improving efficiency by facilitating patterning in a manner of using metal containing a mixture of an alkaline earth metal and an organic matter as a cathode.

Description of the Related Art

Recently, as the information age has fully arrived, the field of displays that visually display electrically conveyed information signals has developed rapidly. In response to this, various kinds of flat panel display devices having excellent characteristics such as a small thickness, a low weight, and low power consumption have been developed and have rapidly replaced the existing Cathode Ray Tubes (CRTs).

Representative examples of such flat panel display devices may include a Liquid Crystal Display (LCD) device, a Plasma Display Panel (PDP) device, a Field Emission Display (FED) device, an Organic Light-Emitting Display (OLED) device, a quantum dot display device, etc.

Among these devices, a self-luminescence display device such as an organic light-emitting display device or a quantum dot light-emitting display device is considered a competitive application because it does not require a separate light source and enables realization of a compact device design and vivid color display.

Meanwhile, a self-luminescence display device includes a plurality of pixels on a substrate and a light-emitting diode having anode and cathode electrodes confronting each other within each of the pixels and a light-emitting layer between the anode and cathode electrodes.

Since the self-luminescence display device implements a display with light emitting from the light-emitting diode, it is important to effectively extract light emitting from the light-emitting diode. Hence, many ongoing efforts are made to reduce a thickness of a cathode electrode located in a light-emitting direction in order to increase transmittance and raise reliability of the cathode electrode and configurations adjacent to the cathode electrode for the performance stability of the device.

In addition, the demand for a transparent display device, which is capable of displaying an image without interrupting a field of vision in a manner of enabling light transmission through front and rear sides, is rising.

The transparent display device intends to obtain both a transparent display and a light-emitting display by differentiating an arrangement of light-emitting diodes on a self-luminescence region and a transparent region.

However, since the self-luminescence region and the transparent region need to consider the efficiency increase of light emission and transmittance most preferentially, respectively, they demand different structures due to different purposes, thereby having difficulty in being implemented by a common forming method.

BRIEF SUMMARY

Accordingly, the present disclosure is directed to a display device and method for manufacturing the same that substantially obviate one or more problems due to limitations and disadvantages of the related art.

An object of the present disclosure is to provide a display device, and more particularly, to a display device and method for manufacturing the same, suitable for securing high transmittance and improving efficiency by facilitating patterning in a manner of using metal comprising a mixture of an alkaline earth metal and an organic matter as metal used as a cathode.

Additional advantages, objects, and features of the disclosure will be set forth in part in the description that follows and in part will become apparent to those having ordinary skill in the art upon examination of the following or may be learned from practice of the invention. The objectives and other advantages of the disclosure may be realized and attained by the structure particularly pointed out in the written description and claims hereof as well as the appended drawings.

A display device of the present disclosure enables deposition patterning of a cathode by changing components of a cathode, thereby securing both high transmittance and high efficiency.

To achieve these objects and other advantages and in accordance with the purpose of the disclosure, as embodied and broadly described herein, a display device according to one embodiment may include an anode at each of a plurality of light emitting parts of a substrate, a light emitting layer provided over each anode, and a cathode over the light emitting layer to overlap the plurality of the light emitting parts of the substrate, the cathode comprising alkaline earth metal and fullerene complexed with the alkaline earth metal.

In another aspect of the present disclosure, as embodied and broadly described herein, a method of manufacturing a display device according to another embodiment may include the steps of providing an anode at each of a plurality of light emitting parts of a substrate, providing a light emitting layer over each anode, and providing a cathode by depositing a mixture of alkaline earth metal and fullerene over the light emitting layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the invention.

FIG. 14 is a graph showing J-V characteristics according to elapsed time of an Mg—$C_{60}$ cathode.

FIG. 15A is a cross-sectional diagram of a display device according to a seventh test example.

FIG. 15B is a cross-sectional diagram of a display device according to an eighth test example.

FIG. 15C is a cross-sectional diagram of a display device according to ninth to twelfth test examples.

DETAILED DESCRIPTION

Figure 1:
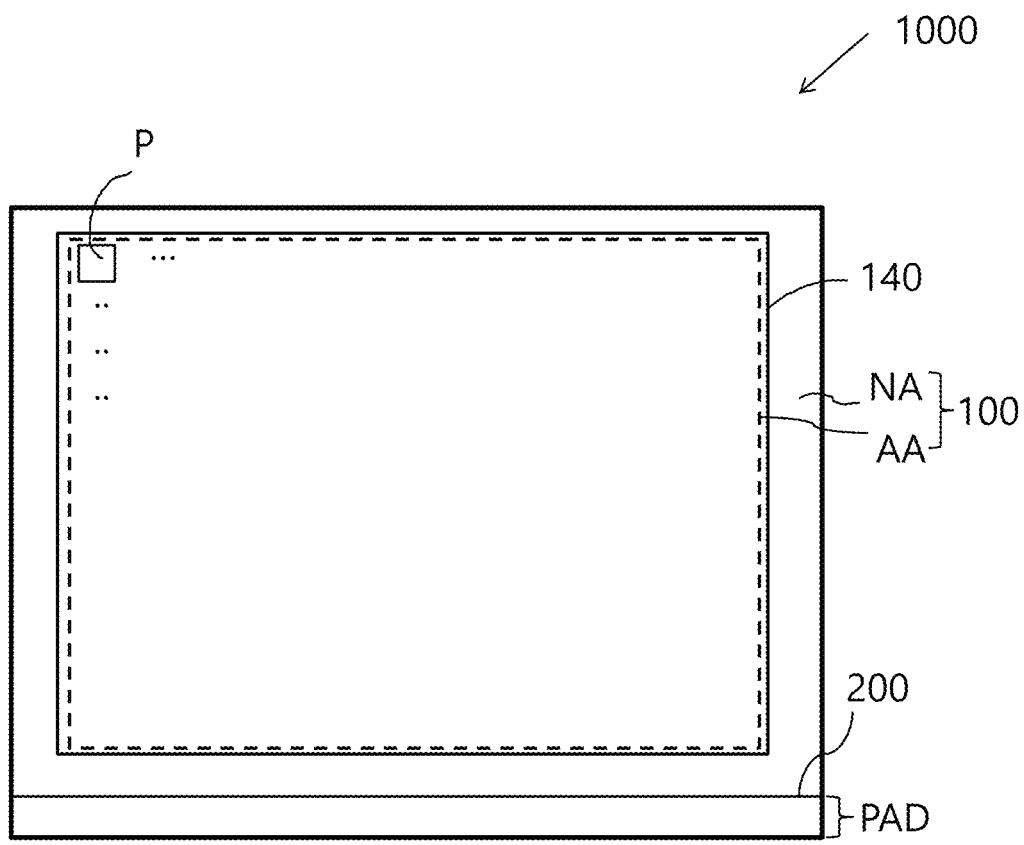
FIG. 1 is a layout showing a display device according to the present disclosure.

Description will now be given in detail according to exemplary embodiments disclosed herein, with reference to the accompanying drawings. Throughout the specification, the same reference numbers mean substantially the same components. In the following description, if it is determined that a specific description of the technology or configuration related to the present disclosure may unnecessarily obscure the gist of the present disclosure, the detailed description shall be omitted. In addition, the component names used in the description below are selected in consideration of the ease of preparation of the specification and may differ from the part names of the actual products.

In the drawings for explaining the exemplary embodiments of the present disclosure, for example, the illustrated shape, size, ratio, angle, and number are given by way of example, and thus, are not limited to the disclosure of the present invention. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless it is used along with the term "only". The singular forms are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "aside", or the like, one or more other parts may be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used.

In the description of the various embodiments of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various embodiments of the present disclosure may be partially or wholly coupled to and combined with each other, and various technical linkage and driving thereof are possible. These various embodiments may be performed independently of each other, or may be performed in association with each other.

A display device of the present disclosure is mainly characterized in that a cathode used as one electrode of a light-emitting device within a substrate is formed in form of a mixture comprising alkaline earth metal and fullerene. As the cathode consisting of the mixture of alkaline earth metal and fullerene generates a complex between some carbon atoms of fullerene and the alkaline earth metal, a metal carbide is produced, whereby electrode reliability can be enhanced. In addition, it is able to improve the transmittance lowered when a single Mg layer is used. Moreover, considering that a deposition temperature in an alloy structure is high over 500° C., as a cathode deposition temperature of the mixture structure becomes similar to an organic deposition temperature, an FMM mask is available for a deposition process and patterning is facilitated.

FIG. 1 is a layout showing a display device according to the present invention.

Referring to FIG. 1, a display device 1000 according to the present disclosure includes a substrate 100 divided into an active area AA (i.e., an inside of a dotted line area) and a non-active area NA.

A plurality of pixels P are provided to the active area AA. As a light-emitting device (e.g., OLED in FIG. 3 or FIG. 5) and a thin film transistor (e.g., TFT in FIG. 3 or FIG. 5) configured to drive the light-emitting device are formed in each of the pixels P, whereby a display is performed by an operation of the light-emitting device per pixel.

The non-active area NA exists outside the active area AA. A pad part PAD is located in some of the non-active area and a pad electrode (not shown) is provided to the pad part PAD, whereby a signal is applied from outside by a connection to a circuit film (not shown) and the like. Link wires extended from the wires provided to the active area AA are provided to the non-active area NA of the sides on which the pad part PAD is not formed and connected to the pad part PAD. The circuit film is connected to a circuit board (not shown), thereby transferring an electrical signal from the circuit board to a pad electrode side. Thin film transistors TFT1, TFT2 and TFT3 may be connected to first and second wires (not shown) crossing with each other.

The substrate 100 may be transparent like a glass or a transparent plastic film. Alternatively, the substrate 100 may include a metal substrate that is non-transparent. If the display device 1000 includes a transmitting part (see 'T' in FIG. 4), the substrate 100 may be formed of a material (e.g., a glass substrate, a transparent plastic film, etc.) that is transparent enough for backside transmission. Although the substrate 100 generally includes the transparent plastic film for the purpose of permanent or in-use device flexibility, the glass substrate is applicable in a manner of decreasing thickness of its own.

Each pixel P includes one or more light-emitting devices (e.g., OLEDs), and a capping layer (see '170' in FIG. 3 or FIG. 5) may be formed on the light-emitting device (OLED) for the light extraction improvement and the protection of the light-emitting device (OLED).

In the display device according to the present disclosure, a cathode 140 is formed in all of the active area AA and some of the non-active area NA via the active area AA. The cathode 140 of the display device according to the present disclosure and an anode 111 constitutes both electrodes of the light-emitting device (OLED). When the display device is used as a top luminescence device, it is important for the cathode 140 of the present disclosure to maintain transmission capability. If the cathode 140 contains metal, it should be a thin film. In addition, as shown in FIG. 1, since the cathode 140 is formed to cover the entire active area AA, it is important to form a uniform potential surface without deviation per pixel area. To this end, conductivity of components providing the cathode 140 should be above a predetermined level, whereby the components for the cathode configuration are important. The cathode 140 of the present disclosure is formed in a manner of mixing fullerene or fullerene derivatives with alkaline earth metal, thereby intending to secure transparency and low resistance.

Meanwhile, as shown in FIG. 1, an encapsulation layer 200 is formed on the active area AA and the non-active area NA except the pad part PAD so as to cover the cathode 140 completely. The encapsulation layer 200 prevents moisture permeability from outside and protects an array configuration (including thin film transistors) formed on the whole active area AA as well as the light-emitting devices (OLED), and thus is formed in a size greater than that of the cathode 140, one of the components of the light-emitting device (OLED). Thus, the encapsulation layer 200 may be formed in a manner of covering the top and lateral sides of the cathode 140 of the light-emitting device (OLED).

In some embodiments, the encapsulation layer 200 may be formed as a stacked layer including an inorganic encapsulation layer, an organic encapsulation layer and an inorganic encapsulation layer. Besides, a pair of organic/inorganic encapsulation layers may be further added. The inorganic encapsulation layer is further formed outside the organic encapsulation layer at least, thereby enabling the inorganic encapsulation layer to prevent external moisture permeability. The organic encapsulation layer is provided to cover internal particles or a particle flow by an internal gas according to an environment condition in the course of a process.

The cathode 140 has a wire connected to the pad part PAD and a prescribed access part (not shown) on the substrate 100, thereby receiving a ground signal or a predetermined voltage signal from the pad part PAD.

The cathode 140 is formed in a manner of being integrated for the whole active area AA as opposed to the anode 111 individually formed per subpixel SP. In order to maintain a predetermined potential without a per-region difference for the stable operations of organic light-emitting devices (OLEDs), it is important for the cathode 140 to maintain low resistivity.

Hereinafter, a display device according to a detailed embodiment of the present disclosure is described with reference to cross-sectional diagrams according to various embodiments of the present invention.

Figure 2:
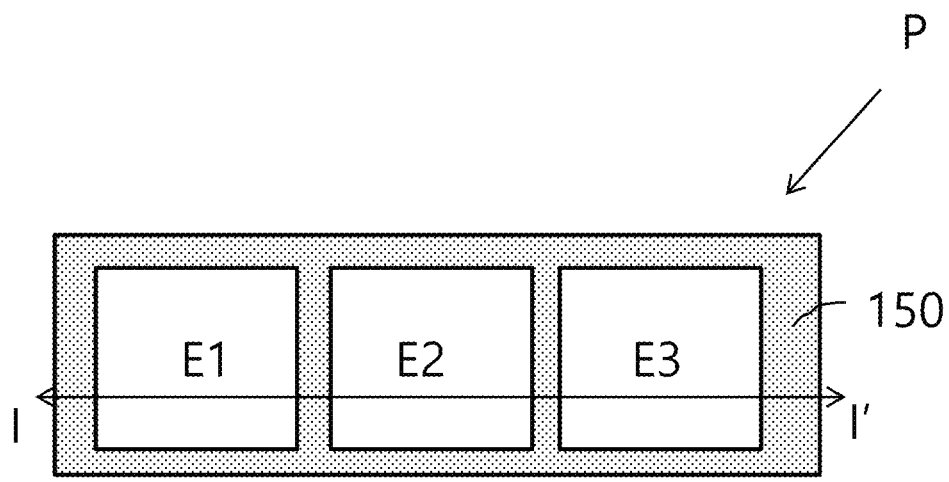
FIG. 2 is a layout showing a pixel of a display device according to a first embodiment of the present disclosure.
Figure 3:
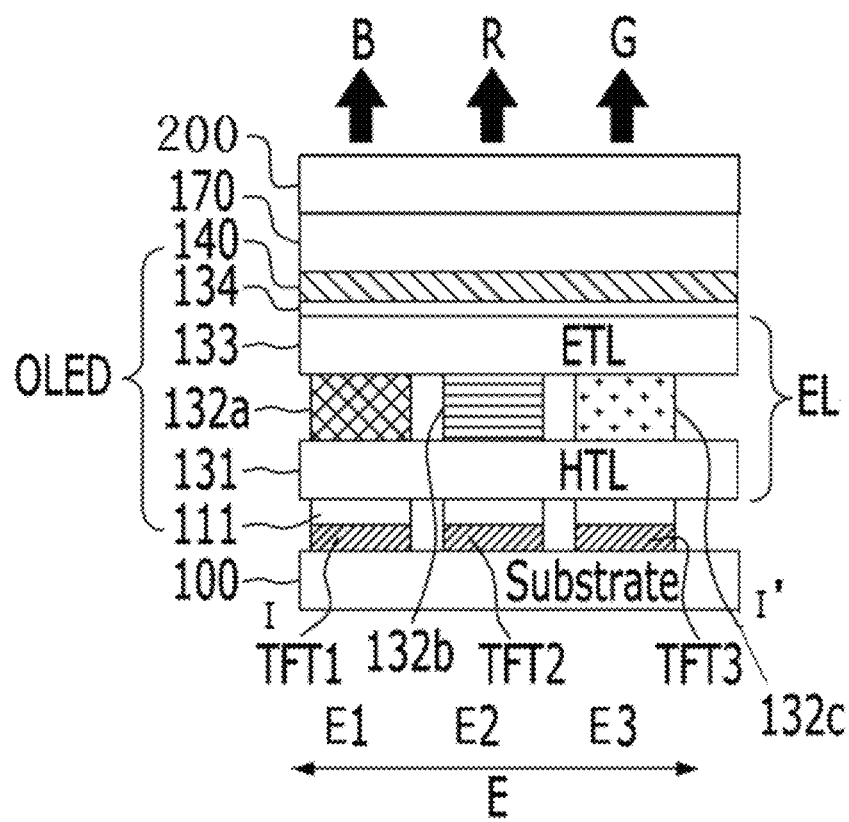
FIG. 3 is a cross-sectional diagram taken along a line I-I' of FIG. 2.

FIG. 2 is a layout showing a pixel of a display device according to a first embodiment of the present disclosure, and FIG. 3 is a cross-sectional diagram taken along a line I-I' of FIG. 2.

A display device according to a first embodiment of the present disclosure in FIG. 2 and FIG. 3 may include an node 111 provided to each of a plurality of light emitting parts E1, E2 and E3 of a substrate 100, a light emitting layer 132a/132b/132c provided on the corresponding anode 111, and a cathode 140 comprising alkaline earth metal and fullerene complexed with the alkaline earth metal on the light emitting layer in a manner of overlapping the plurality of the light emitting parts of the substrate 100.

A light emitting device OLED is provided to each of the light emitting parts E1, E2 and E3, thereby emitting light. A type of the light emitting device OLED may include an organic light emitting device OLED or an inorganic light emitting device OLED depending on whether an inner light emitting layer is an organic light emitting layer or an inorganic light emitting layer, by which the present disclosure is non-limited.

The light emitting device OLED includes the anode 111, an organic stack EL and the cathode 140. The anode of the corresponding light emitting part E1/E2/E3 is connected to a corresponding thin film transistor TFT1/TFT2/TFT3, thereby receiving an electrical signal.

As shown in FIG. 2, a pixel P may include a blue light emitting part E1, a red light emitting part E2 and a green light emitting part E3 or a combination of other colors instead. The pixel P shown in the drawing may be repeated on a matrix in the active area AA of the substrate 100.

The light emitting parts E (i.e., E1, E2 and E3) may be in parallel in the same row for example. Alternatively, the light emitting parts E may be arranged in a diagonal direction. Alternatively, the light emitting parts E may be arranged in a manner of having a different arrangement in a column. Although the light emitting parts E have the same size, by which the present disclosure is non-limited. Alternatively, the light emitting parts E may have different sizes according to intended characteristics of the display device, thereby being changeable by giving a weight or subtraction to a specific light emitting part. The shapes of the light emitting parts E (i.e., E1, E2 and E3) are rectangular in the drawing, by which the present disclosure is non-limited. Alternatively, the shapes of the light emitting parts E (i.e., E1, E2 and E3) may be polygonal or elliptical or some corners of the light emitting parts E may be rounded at least. In some embodiments, the corners of the light emitting parts E (i.e., E1, E2 and E3) may be arranged in a manner of neighboring to each other by being spaced apart from each other in a predetermined distance.

An arrangement of the light emitting parts E1, E2 and E3 emitting lights in different colors of the light emitting part E may include the above-mentioned blue, green and red subpixels for example, by which the present disclosure is non-limited. The light emitting part E may further include a white light emitting part WE. The blue/green/red arrangement of the light emitting part E may be replaced by other arrangements (e.g., cyan/magenta/yellow, etc. In addition, the light emitting part E may have arrangements of other color combinations of the light emitting parts.

Although the following description is mainly applicable to an organic light emitting device using an organic light emitting layer as a light emitting layer, a case of providing a quantum dot light emitting device (QLED) to a light emitting part by changing the organic light emitting layer into a layer including a quantum dot light emitting layer is applicable to the display device of the present disclosure.

Meanwhile, a region may be defined in a manner such that a bank 150 is provided around the light emitting part E (i.e., E1, E2 and E3) and a transmitting part T. The bank 150 may overlap with an edge of the anode 111 in part.

The organic stack EL includes a light emitting layer 132a/132b/132c generating substantial light emission by recombination of hole and electron, a hole transport layer (HTL) 131 transporting a hole from the anode 111 to the light emitting layer 132a/132b/132c, and an electron transport layer (ETL) transporting an electron from the cathode 140 to the light emitting layer 132a/132b/132c.

A hole injection layer (not shown) may be further included between the hole transport layer 131 and the anode 111, and an electron injection layer 134 may be included between the electron transport layer 133 and the cathode 140. The electron injection layer 134 may include an inorganic compound such as an alkaline compound or a lanthanide metal without comprising an organic matter, and may be formed in a process for forming the cathode 140.

The hole injection layer and the electron injection layer 134 may be omitted. In some embodiments, each of the hole transport layer 131 and the electron transport layer 133 may be formed as a multi-layer by giving different functionality thereto.

The bank 150 is formed in a region of each pixel P not provided with the light emitting parts E1, E2 and E3. The light emitting parts E1, E2 and E3 may be defined as an open region of the bank 150.

Meanwhile, a capping layer 170 is further provided on the light emitting device OLED for the protection and light extraction of the light emitting device OLED, and the encapsulation layer 200 is formed on the capping layer 170 for the prevention of external moisture penetration and the protection of the light emitting device OLED and the thin film transistors TFT1, TFT2 and TFT3.

Although the bank 150 is omitted from FIG. 3 for the description of the configuration of the light emitting device OLED of each of the light emitting parts E1, E2 and E3 and the optical effect thereof, the bank 150 overlapping with the edge of the anode 111 in part may be further formed to define the light emitting parts E1, E2 and E3 before forming the organic stack EL and after forming the anode 111.

Figure 4:
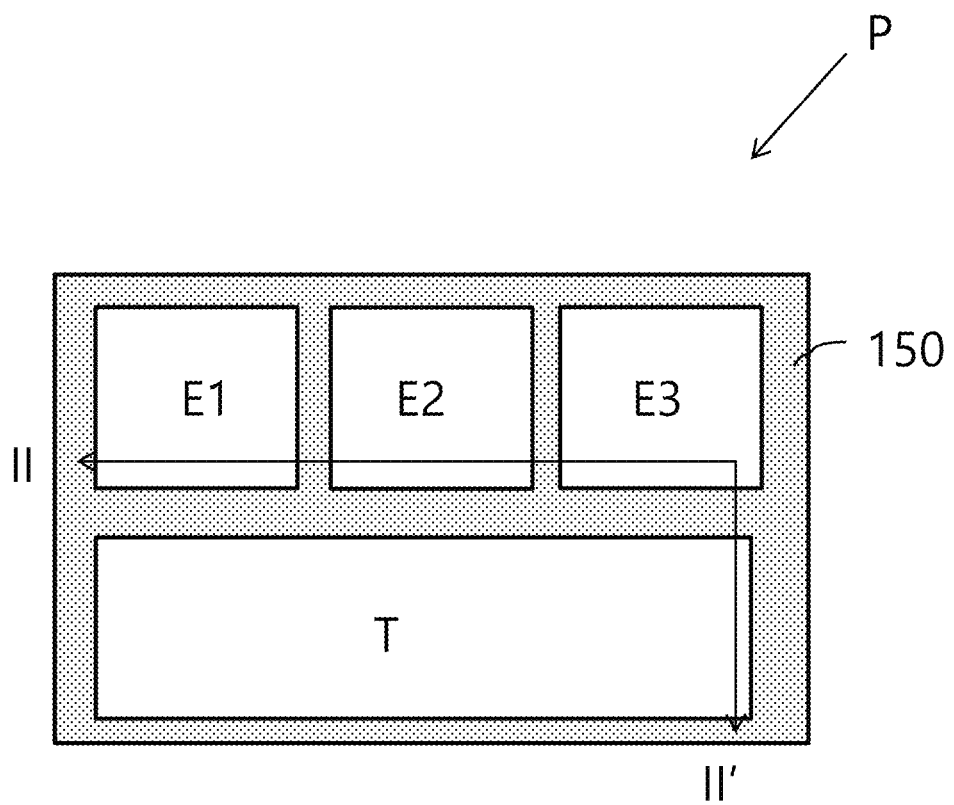
FIG. 4 is a layout of a pixel of a display device according to a second embodiment of the present disclosure.
Figure 5:
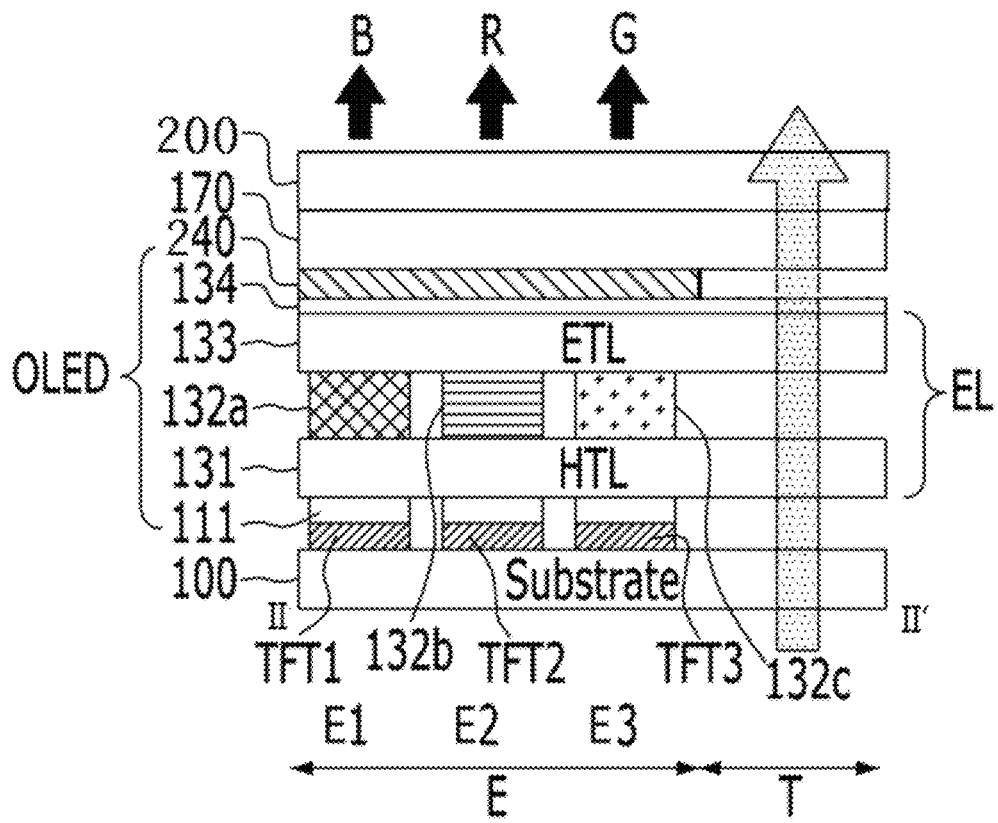
FIG. 5 is a cross-sectional diagram taken along a line II-II' of FIG. 4.

FIG. 4 is a layout of a pixel of a display device according to a second embodiment of the present disclosure, and FIG. 5 is a cross-sectional diagram taken along a line II-II' of FIG. 4.

As shown in FIG. 4 and FIG. 5, a display device according to a second embodiment of the present disclosure further includes a transmitting part T provided to a pixel P as well as light emitting parts E1, E2 and E3, each of which is a subpixel. A structure of the pixel P shown in FIG. 4 may be repeatedly arranged in the active area AA of the substrate 100 shown in FIG. 1.

In the display device according to the second embodiment of the present disclosure, as shown in FIG. 5, a cathode 240 may be patterned in a manner of excluding the transmitting part T.

Through this, as the cathode 240 is excluded from a light path proceeding in the transmitting part T, a light transmission rise occurs by a light absorption amount occupied by a metal component contained in the cathode 240. In this case, since components of thin film transistors TFT, the anode 111, light emitting layers 132a, 132b and 132c and the cathode 240 in comparison to the light emitting parts E1, E2 and E3 in the transmitting part T are excluded from the light path, and more particularly, an electrode component having reflexibility is excluded, light enough to be observed from a backside of the substrate 100 passes through an encapsulation layer 200 from a bottom of the substrate 100.

In the display device according to the second embodiment of the present disclosure, the configuration of the light emitting parts E (i.e., E1, E2 and E3) is identical to the aforementioned first embodiment and its description will be omitted.

Meanwhile, as a bank 150 is omitted from the transmitting part T, it helps the transmission capability.

In the display device according to the second embodiment of the present disclosure, as shown in FIG. 4, the bank 150 may be configured to open and separate the light emitting part and the transmitting part.

Both of the display device according to the first embodiment of the present disclosure of FIG. 2 and FIG. 3 and the display device according to the second embodiment of the present disclosure of FIG. 4 and FIG. 5 may include the cathode 140/240 overlapping with the plurality of the light emitting parts E1, E2 and E3 of the substrate 100 and comprising an alkaline earth metal and fullerene complexed with the alkaline earth metal.

Hereinafter, fullerene used for a cathode of the present disclosure is described.

Figure 6A:
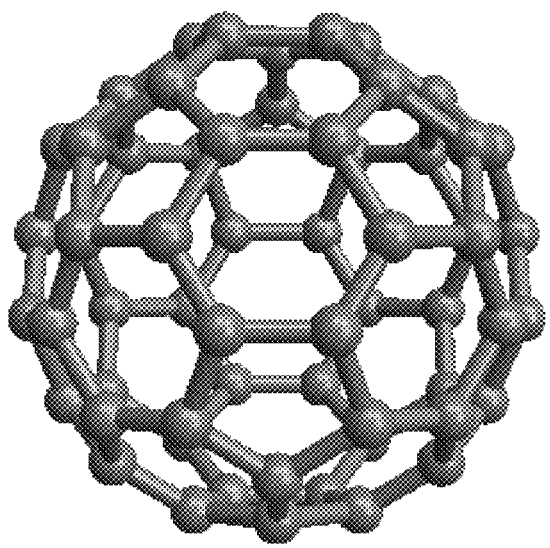
FIG. 6A is a diagram showing an example of fullerene $C_{60}$ usable in a cathode of a display device of the present disclosure.
Figure 6B:
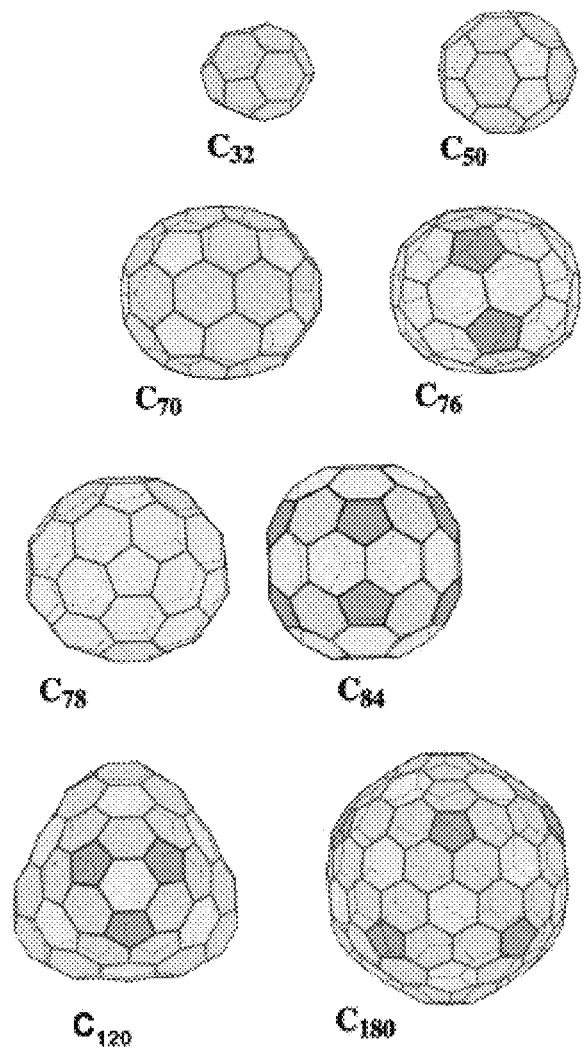
FIG. 6B shows various examples of fullerenes.
Figure 7:
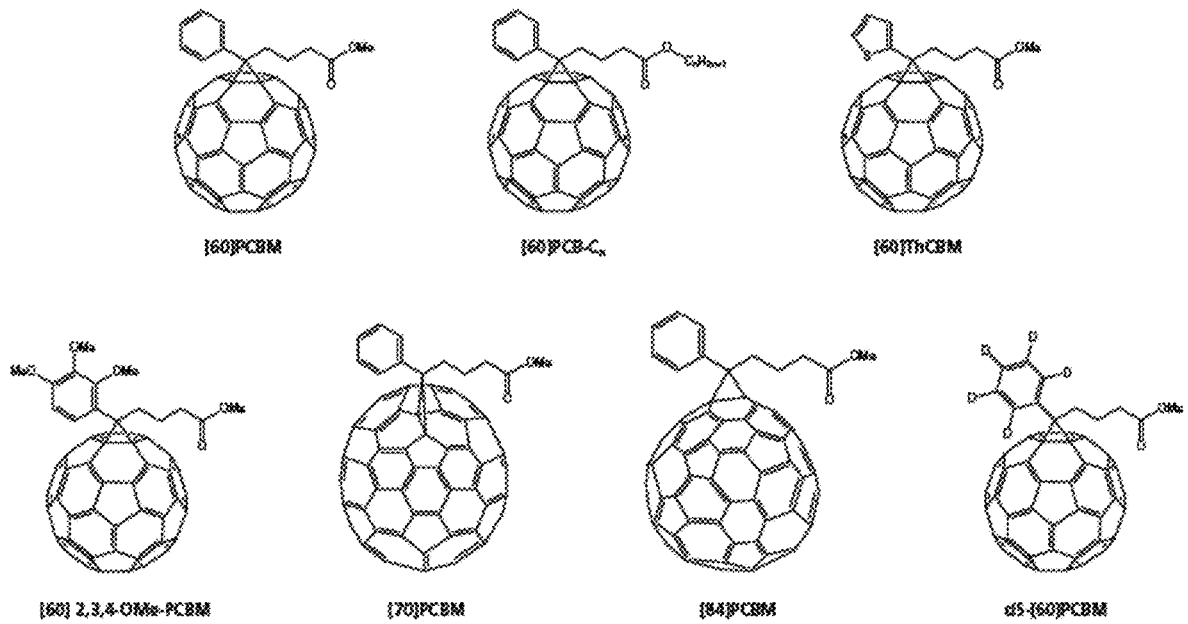
FIG. 7 shows various examples of fullerene derivatives usable in a cathode of a display device of the present disclosure.

FIG. 6A shows an example of fullerene $C_{60}$ containable in cathode components of a display device of the present disclosure and FIG. 6B shows various examples of fullerenes. FIG. 7 shows fullerene derivatives containable in cathode components of a display device of the present disclosure. FIGS. 8A to 8D shows examples of complexes formed between alkaline earth metal and fullerene usable in a cathode of a display device of the present invention.

As shown in FIG. 6A and FIG. 6B, fullerene is an organic compound of carbons and has a three-dimensional shape that forms a stable form in a spherical or oval or similar form. In fullerene, a pentagonal or hexagonal carbon combination structure is repeated on a three-dimensional surface, and carbon is placed at the location of each vertex of the pentagon or hexagon.

Fullerene has structural symmetry because its carbon-combination structure is not one-sided, and it also has high stability owing to the properties of delocalized π electrons coming from a spherical or elliptical shape.

As shown in FIG. 6A, the typical example of fullerene is $C_{60}$, by which fullerene used as one component of a cathode of a display device of the present disclosure is non-limited. Moreover, a spherical or oval carbon aggregate with the delocalized π electron properties over $C_{20}$ may be altered to a different structure with a different number of carbons other than $C_{60}$. For example, fullerene can be implemented as a form of carbon that contains 20 or more carbon atoms such as $C_{20}$, $C_{24}$, $C_{28}$, $C_{32}$, etc.

FIG. 6B shows examples of fullerenes such as $C_{32}$, $C_{50}$, $C_{70}$, $C_{76}$, $C_{78}$, $C_{84}$, $C_{120}$, and $C_{180}$ by differentiating the number of carbon atoms from fullerene $C_{60}$. The number of hexagonal and pentagonal combination structures fitted to the spherical or oval surface of fullerene may vary with the change in the number of carbon atoms of fullerene. In addition, even the same number of carbon atoms may slightly vary the three-dimensional shape of fullerene depending on the orbital bonding properties.

FIG. 7 shows fullerene derivatives that are n-type fullerene derivatives of high electron mobility.

A fullerene derivative that contains a functional group as an isomer, such as PCBM (6,6-phenyl $C_{61}$ butyric acid methyl ester), as well as single $C_{60}$ as fullerene, can also be used as a component contained in a cathode of the present invention.

As such, the formation of a cathode by including fullerene derivatives in alkaline earth metal may have the advantage of increasing the electron injection property in the cathode. In some embodiments, if the cathode itself contains organic fullerene derivatives and the electron permeability of the fullerene derivatives is high, it may be possible to implement an organic light emitting device in the form of omitting the electron injection layer 134 of FIG. 3 or FIG. 5. In this case, the cathode 134 may directly contact with the electron transport layer 133.

Meanwhile, when a cathode is formed, organic fullerene and alkaline earth metal are co-deposited by being included in a single crucible. In doing so, substance is supplied in a manner that a content of alkaline earth metal is greater than organic fullerene, and more preferably, a ratio of alkaline earth metal to organic fullerene is 10:1 to 20:1. After the formation, fullerene over total volume of the cathode may be contained in a content of 1 Vol % to 10 Vol %.

In the cathode 140, alkaline earth metal controls electric conductivity of the cathode 140 and reflexibility capable of inducing reflective resonance of strong cavity property between the anode 111 and the cathode 140 in the light emitting device (OLED), and should be included in a greater amount than the fullerene or fullerene derivatives when taking into consideration of the electro-optical function of the cathode 140. Hence, in the whole structure of the cathode 140, alkaline earth metal becomes a major component and fullerene or fullerene derivatives may be included in alkaline earth metal as dopants.

In the display device according to the present disclosure in FIGS. 1 to 5, the light emitted from the light emitting layer 132a/132b/132c is finally projected toward the cathode 140 through resonance and reflection between the anode 111 and the cathode 140. To this end, a reflective electrode of Al, Al alloy, Ag, Ag alloy, Mg, Mg alloy, APC (Ag—Pd—Cu) or the like may be included in the anode 111. The cathode 140 contains alkaline earth metal having reflective transmission capability to enable final light transmission.

In the display device, the alkaline earth metal used for the cathode 140 includes at least one of Mg, Ca, Be, Sr, Ba, and Ra.

Figure 8A:
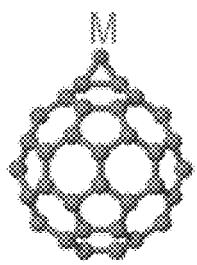
FIGS. 8A to 8D show examples of complexes formed between alkaline earth metal and fullerene usable for a cathode of a display device of the present disclosure.
Figure 8B:
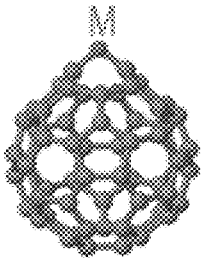
Figure 8C:
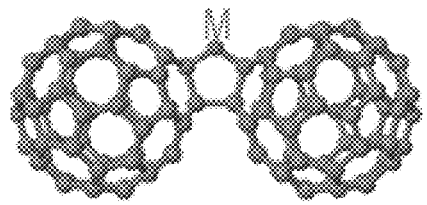
Figure 8D:
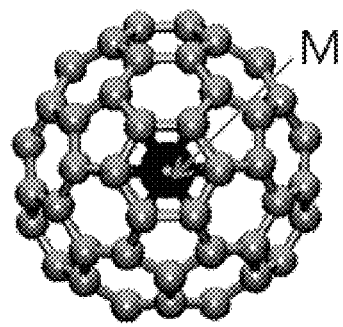

Meanwhile, as alkaline earth metal M and fullerene are co-deposited to form a layer of the cathode 140, carbon atoms contained in fullerene can form a complex with the alkaline earth metal M (FIG. 8A] or on-site carbon (C) atoms can form a complex with the alkaline earth metal M by breaking double bonds (FIG. 8B]. Alternatively, as shown in FIG. 8C, as alkaline earth metal M is situated between fullerene monomers, carbon atoms of both monomers and alkaline earth metal M may be complexed together. In other configurations, as shown in FIG. 8D, alkaline earth metal M goes into the three-dimensional structure to form a complex with at least one carbon atom on the surface.

In some implementations, regarding the complexation of fullerene derivatives shown in FIG. 7 and alkaline earth metal, a functional group of fullerene derivatives and alkaline earth metal may be complexed together, at least one carbon atom of a fullerene derivative surface and alkaline earth metal may be complexed together, or alkaline earth metal may go into a three-dimensional structure of fullerene derivatives and then form a complex with neighboring carbon atom(s).

Thus, according to the display device of the present disclosure, as a cathode is formed by complexation of fullerene and alkaline earth metal, an alkaline earth metal complex is generated in the cathode. Therefore, interfacial resistance is reduced and conductivity of the cathode is improved owing to the metal doping effect. When the complexation between carbon of the fullerene and the alkaline earth metal is generated, it works as metal carbide, thereby increasing conductivity and stabilizing layer characteristics. Thus, surface stabilization and reliability can be enhanced. In addition, as the alkaline earth metal is contained as a major component of the cathode, low resistivity of the alkaline earth metal can be maintained. Meanwhile, in the cathode 140, metal carbide ($MC_2$ or $Mg_2C_3$) generated from the complexation between carbon atom and alkaline earth metal may vary depending on the fullerene content.

In the display device of the present disclosure, since each light emitting part is implemented to have a strong cavity effect, the corresponding light emitting layers 132a, 132b and 132c between the anode 111 and the cathode 140 may differ from each other in thickness for the optimal resonance effect.

Meanwhile, alkaline earth metal and fullerene or fullerene derivatives contained in the cathode of the present disclosure have similar deposition temperatures below 500° C. In this case, since alkaline earth metal is metal but has a low deposition temperature, cathode deposition is possible at the heat-resisting temperature of an FMM mask and a cathode that can be patterned may be formed in a deposition process. On the other hand, when a cathode comprising a metal such as Ag is formed, since a corresponding deposition temperature is 800° C. or higher, deformation is generated on using Fine Metal Mask (FMM). Thus, patterning is impossible.

In addition, when a cathode comprising a metal such as Ag is formed, another metal having a low deposition temperature is usable as additional metal. In this case, since evaporation points are different, it is impossible to use in the same source, whereby individual crucibles need to be used disadvantageously.

The cathode of the display device according to the present disclosure uses alkaline earth metal and organic fullerene, which have similar deposition temperatures below 500° C., whereby the same crucible can be used. Therefore, alkaline earth metal and fullerene can be co-deposited in a manner of being included as a mixture in the same source.

Hereinafter, a method of forming the cathode of the display device according to the first embodiment is described.

Figure 9:
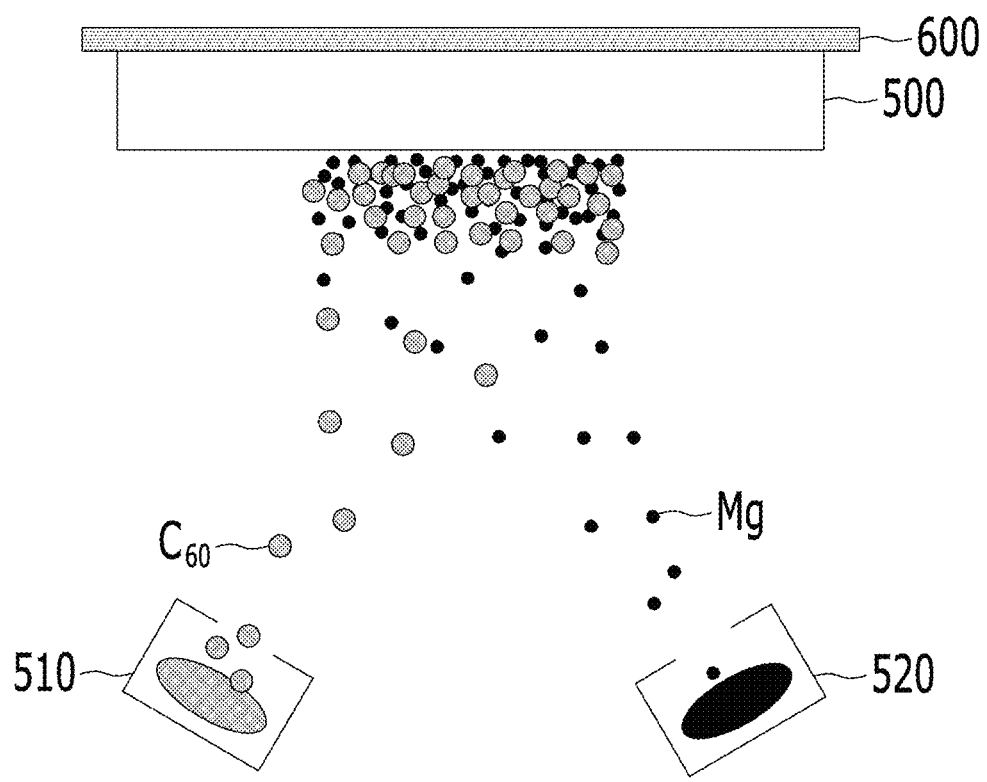
FIG. 9 is a diagram showing a method of forming a cathode in a display device according to a first embodiment of the present disclosure.

FIG. 9 is a diagram showing a method of forming a cathode in a display device according to a first embodiment of the present invention.

Referring to FIG. 9, in the display device according to the first embodiment, the cathode 140 is formed to cover the light emitting parts E1, E2 and E3 provided to each subpixel P of the active area AA. Since the cathode 140 is formed in the whole active area AA, it is not necessary to use an FMM deposition mask. Hence, by supplying fullerene $C_{60}$ and alkaline earth metal such as Mg from different sources 510 and 520, respectively and maintaining the vaporization conditions of the sources 510 and 520 identically or similarly, cathode matter can be fully formed on a substrate 500.

Here, a reference number 600 refers to a stage that fixes the substrate 500 within a chamber (not shown), and a deposition process is progressed on the stage 600.

Figure 10:
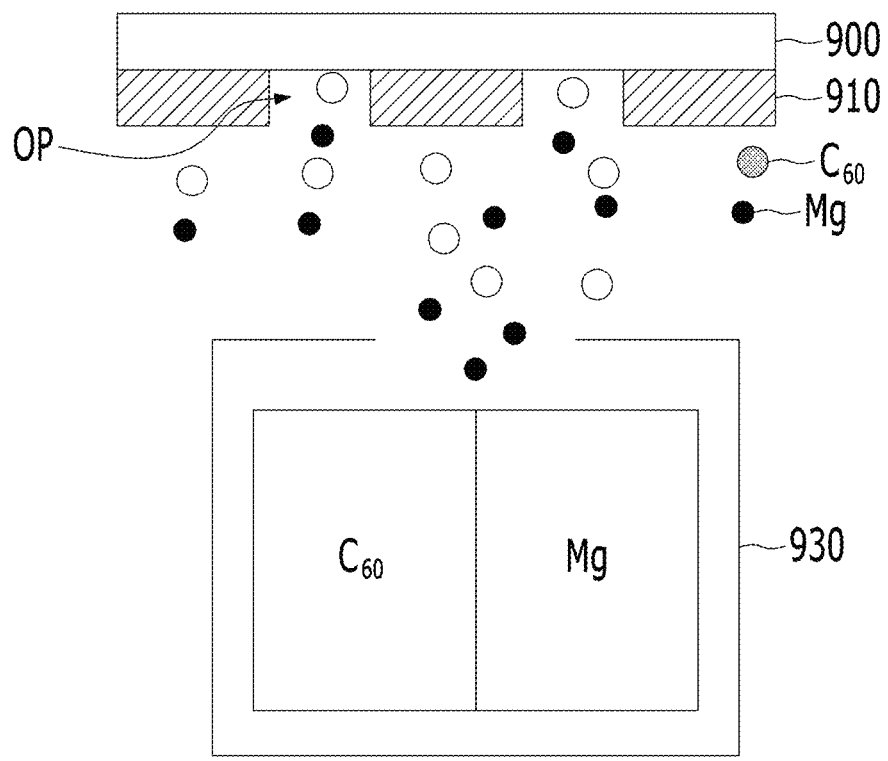
FIG. 10 is a diagram showing a method of forming a cathode in a display device according to a second embodiment of the present disclosure.

FIG. 10 is a diagram showing a method of forming a cathode in a display device according to a second embodiment of the present invention.

Referring to FIG. 10, in a display device according to a second embodiment of the present disclosure, a pixel P further includes a transmitting part T as well as light emitting parts E1, E2 and E3, each of which may be a subpixel. In order to raise transmittance of the transmitting part T, cathode matter can be selectively deposited on a non-transmitting part only using an FMM mask 910 having a region except the transmitting part T as an open region OP. Here, the FMM mask 910 is usable because fullerene $C_{60}$ and alkaline earth metal (Mg) have similar deposition temperatures of 500° C. or below.

In addition, since the deposition temperatures of fullerene $C_{60}$ and alkaline earth metal (Mg) are similar to each other, fullerene and alkaline earth metal are supplied in a manner such that regions are divided in the same source 930, evaporated through the same crucible supplying heat to the same source, and deposited on the open region OP within the FMM mask 910, whereby a cathode (e.g., cathode 240 in FIG. 5) can be formed in the region except the transmitting part T. In this case, as shown in the layout of FIG. 4, the cathode 240 is integrated in the active area ('AA' in FIG. 1) at least in a whole shape having an open region (hole) to correspond to the transmitting part T of each pixel P.

Regarding the display device according to the second embodiment of the present disclosure, as shown in FIG. 10, when a cathode is formed of a mixture of alkaline earth metal and fullerene or a mixture of alkaline earth metal and fullerene derivatives, as a deposition temperature is as low as a temperature of depositing a light emitting layer or a common layer, a deposition chamber is usable in common and process facilitation is secured.

Hereinafter, properties of a mixture structure of alkaline earth metal and fullerene derivatives used for a cathode of the present disclosure are described through tests.

In the tests, magnesium is representatively used as an exemplary alkaline earth metal for example and fullerene $C_{60}$ is used as an exemplary fullerene.

First of all, a first test example applies AgMg alloy as a cathode in thickness of 140 Å and a second test example applies AgMg alloy as a cathode in thickness of 80 Å. Third to sixth test examples use Mg:$C_{60}$ for a cathode, doping with 5 vol % of $C_{60}$, and having thicknesses of 140 Å, 160 Å, 200 Å, and 240 Å, respectively. A drive voltage, efficiency, and a time T95 until dropping to 95% of luminance in comparison to an initial value are compared with values of the first test example, respectively. A shift voltage ΔV is a value obtained in a manner of implementing a cathode according to each test example and measuring a change by holding it at 100° C. for 240 hours.

TABLE 1

| Classification (cathode) | Device efficiency | | | | ΔV(V) (100° C., held for 240 hours) |
|---|---|---|---|---|---|
| | Drive Voltage (V comparison) | Efficiency ($η_J$) (Cd/A comparison) | Half-width (nm) | T95 (Hrs comparison) | |
| First test example (AgMg 140 Å) | 100% | 100% | 22 | 100% | 0.4 |
| Second test example (AgMg 80 Å) | 100% | 90% | 23 | 85-90% | 0.6 |
| Third test example (Mg:$C_{60}$ 140 Å) [95 vol %:5 vol %] | 100% | 85% | 23 | 95-100% | 0.4 |
| Fourth test example (Mg:$C_{60}$ 160 Å) [95 vol %:5 vol %] | 100% | 90% | 22 | 95-100% | 0.4 |
| Fifth test example (Mg:$C_{60}$ 200 Å) [95 vol %:5 vol%] | 100% | 84% | 20 | 95-100% | 0.5 |
| Sixth test example (Mg:$C_{60}$ 240 Å) [95 vol %:5 vol%] | 100% | 76% | 18 | 65% | 0.5 |

Figure 11:
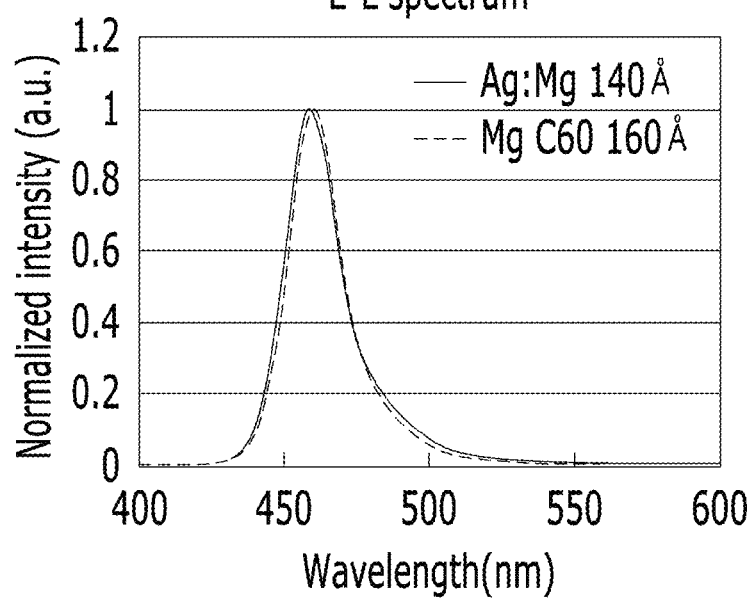
FIG. 11 is a graph showing luminescence characteristics of an AgMg cathode and an Mg—$C_{60}$ cathode.
Figure 12:
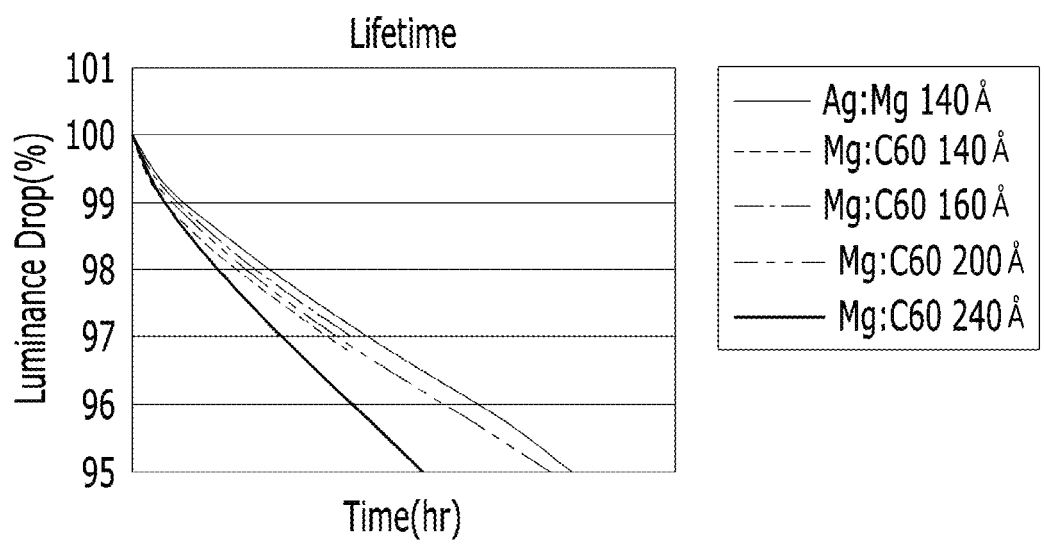
FIG. 12 is a graph showing lifetime characteristics of an AgMg cathode and Mg—$C_{60}$ cathodes differing in thickness.

FIG. 11 is a graph showing luminescence characteristics of an AgMg cathode and an Mg—$C_{60}$ cathode, and FIG. 12 is a graph showing lifetime characteristics of an AgMg cathode and Mg—$C_{60}$ cathodes differing in thickness.

As shown in Table 1, since Ag of high conductivity is not used, the third to sixth test examples show that efficiency is lowered by about 10% in comparison to the first test example. Yet, it can be observed that the third to sixth test examples have levels similar to that of the second test example of thinning thickness of AgMg. Moreover, it can be confirmed that levels of lifetimes or shift voltages of the third to fifth test examples are similar to that of the first test example.

As shown in FIG. 11, it can be confirmed that luminance spectrums are equivalent or similar in the first and fourth test examples. As shown in FIG. 12, it can be observed that lifetimes are almost equivalent in the first test example and the third to fifth test examples.

Namely, like the cathode of the present disclosure, when a mixture of alkaline earth metal and fullerene derivatives is used, the efficiency, lifetime and shift voltage characteristic are similar to those of the first test example. Hence, it can be obtained that the AgMg cathode has the function levels similar to those of metal alloy using alloy comprising organic matter and alkaline earth metal instead of alloy comprising alkaline earth metal and other metal.

In the following test, high-temperature reliabilities of a cathode of a single alkaline earth metal layer and a cathode in a mixture of alkaline earth metal and $C_{60}$ are examined by referring to lifetime characteristics. In tests of FIG. 13 and FIG. 14, J-V characteristics are examined by holding the cathodes at 100° C. for 250 hours.

Figure 13:
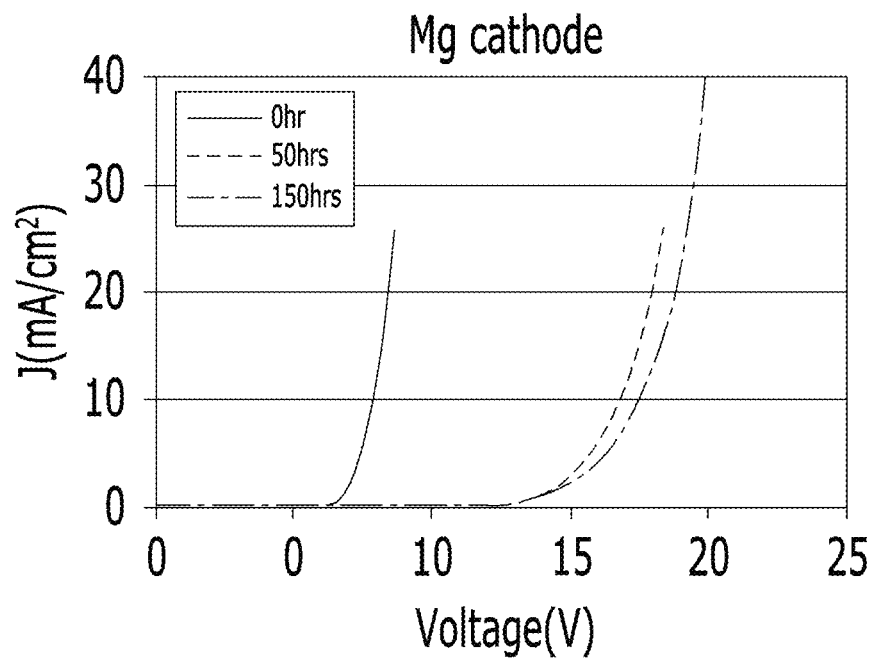
FIG. 13 is a graph showing J-V characteristics according to elapsed time of an Mg cathode.

FIG. 13 is a graph showing J-V characteristics according to elapsed time of an Mg cathode, and FIG. 14 is a graph showing J-V characteristics according to elapsed time of an Mg—$C_{60}$ cathode.

Referring to FIG. 13, in case of applying an Mg cathode of a single layer, a shift voltage is 8.9 V or higher even after the elapse of 50 hours for the same current density 10 mA/cm², which means that a normal operation is impossible. Namely, this means that interfacial consistency on an organic stack EL is reduced due to the weak binding power in case of applying the Mg single layer.

On the other hand, referring to FIG. 14, when an Mg—$C_{60}$ cathode is used, a shift voltage is equal to or lower than 0.4 V at 0 hour, after 50 hours, or after 250 hours, which indicates that high-temperature reliability is remarkably enhanced in case of using a cathode of a mixture of Mg—$C_{60}$ in comparison to an Mg single layer.

Table 2 in the following shows that transparency, sheet resistance, lifetime and high-temperature reliability in the structures of various test examples of a transparent display device configured in FIGS. 15A to 15C.

FIG. 15A is a cross-sectional diagram of a display device according to a seventh test example, FIG. 15B is a cross-sectional diagram of a display device according to an eighth test example, and FIG. 15C is a cross-sectional diagram of a display device according to ninth to twelfth test examples.

In common, a display device according to a seventh test example shown in FIG. 15A, a display device according to an eighth test example shown in FIG. 15B, and a display device according to ninth to twelfth test examples shown in FIG. 15C have the same stack structure consisting of an anode 111, an organic stack EL, a cathode 40a/40b/140, an electron injection layer 34/134, a capping layer 170, and a 3-layered stack including a first organic encapsulation layer 201, an organic encapsulation layer 202 and a second inorganic encapsulation layer 203.

Here, like FIG. 15A among the test examples, the display device of the seventh test example has the electron injection layer 34 formed in thickness of 30 Å of Yb:LiF. In the eighth to twelfth tests, the electron injection layer 134 is formed in the same thickness of 15 Å of Yb only.

The respective test examples differ from each other in the cathode 40a/40b/140. In the seventh test example of FIG. 15A, the cathode 40a is formed in the thickness of 80 Å of AgMg. In the eighth test example of FIG. 15B, the cathode 40b is formed in the thickness of 140 Å of Mg only. The ninth, tenth and twelfth test examples of FIG. 15C set the thickness of 140 Å of Mg:$C_{60}$ in common but differentiate the $C_{60}$-doped quantities into 3 vol %, 5 vol % and 8 vol %, respectively. In the eleventh test example, the $C_{60}$-doped quantity is set to be 5 vol % and the Mg:$C_{60}$ thickness is set to be 200 Å.

The display devices of the seventh to twelfth test examples employ the same configuration except the cathode 40a/40b/140 and the electron injection layer 134.

TABLE 2

| Classification | | 7th test example | 8th test example | 9th test example | 10th test example | 11th test example | 12th test example |
|---|---|---|---|---|---|---|---|
| Electrode structure | Material | AgMg | Mg | | Mg:C60 | | |
| | Thickness | 80 Å | 140 Å | 140 Å | 140 Å | 200 Å | 140 Å |
| | $C_{60}$ | — | — | 3 vol % | 5 vol % | 5 vol % | 8 vol % |
| | Patterning | X | O | O | O | O | O |

TABLE 2-continued

| Classification | 7th test example | 8th test example | 9th test example | 10th test example | 11th test example | 12th test example |
|---|---|---|---|---|---|---|
| Panel transparency at 55% opening ratio | 47% | 55% | 55% | 55% | 55% | 55% |
| Sheet resistance (Ω/Y) | 15 | 20 | 13 | 17 | 10 | 34 |
| Lifetime | 100% | 90% | 90% | 95% | 90% | 90% |
| ΔV(V) (100° C. held for 250 hours) | 0.4 | 8.9 | 0.5 | 0.4 | 0.4 | 0.4 |

Referring to Table 2, since AgMg of the seventh test example becomes a thin film in thickness of 80 Å and contains Ag that requires high-temperature deposition, it is impossible to apply an FMM mask. The Mg cathode of the eighth test example or the Mg:$C_{60}$ cathode of the twelfth test example, which have relatively low deposition temperatures, can be deposited and implemented in a manner that the cathode is not provided for the transmitting part T like FIG. 4. Through this, it can be observed that an opening ratio is secured along an opening ratio of the transmitting part.

Referring to Table 2, in case of the Mg single layer cathode of the eighth test example, as examined in FIG. 13, since the shift voltage ΔV is 8.9 V, it is unable to secure the high temperature reliability.

On the contrary, like the display device of the present disclosure, when the cathodes of a mixture of fullerene $C_{60}$ and Mg of the ninth to twelfth test examples are applied, FMM patterning is available for each of the cathodes, a considerable opening ratio can be secured for a transmitting part through cathode patterning in the transmitting part, lifetime over 90% of the seventh test example can be secured, and a shift voltage ΔV is equal to or lower than 0.5 V in the ninth to twelfth test examples to enable the high-temperature reliability to have the similar level of the AgMg thin layer (seventh test example).

Yet, in case of increasing the doping quantity of fullerene $C_{60}$ in alkaline earth metal such as Mg, sheet resistance tends to increase. If yield is considered as well, a doping quantity of fullerene $C_{60}$ used for the cathode of the present disclosure is preferably equal to or smaller than 10 vol %. In order to solve the problem that high temperature reliability is lowered in case of using the Mg single layer, since fullerene needs to be contained enough to have a predetermined extent of complexation with Mg, about 1 vol % of fullerene or more should be contained in the cathode.

Namely, in the display device of the present disclosure, regarding a cathode formed of a mixture of alkaline earth metal and fullerene, a content of fullerene may range between 1 vol % and 10 vol % approximately.

In addition, through the aforementioned tests, it is confirmed that a display device of the present disclosure has the absolute advantage that patterning is possible using the FMM mask unavailable for the thin film cathode of the seventh test example.

Hereinafter, an example differing from the second embodiment in the shapes of a light emitting part and a transmitting part in a display device of the present disclosure is described.

Figure 16:
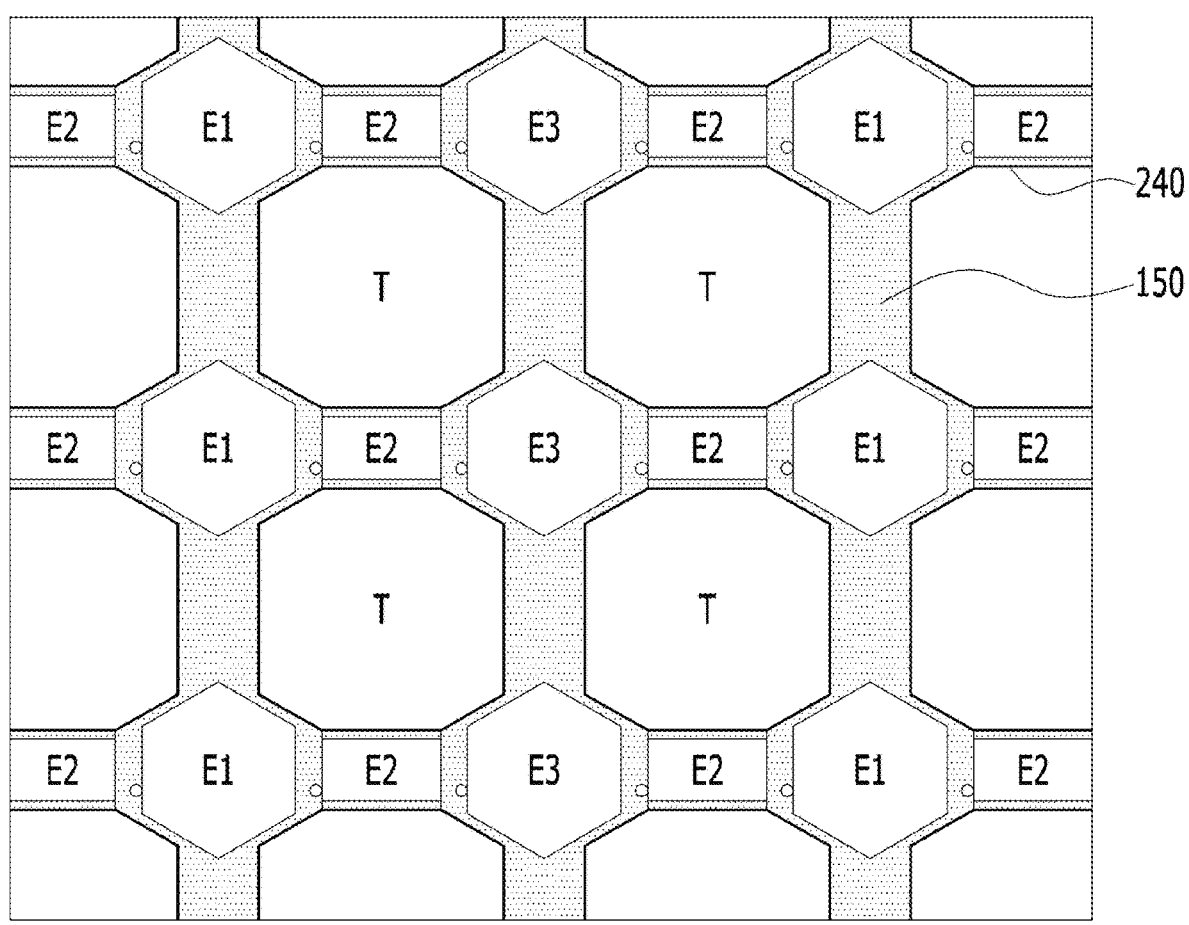
FIG. 16 is a layout showing a display device according to a third embodiment of the present disclosure.
Figure 17A:
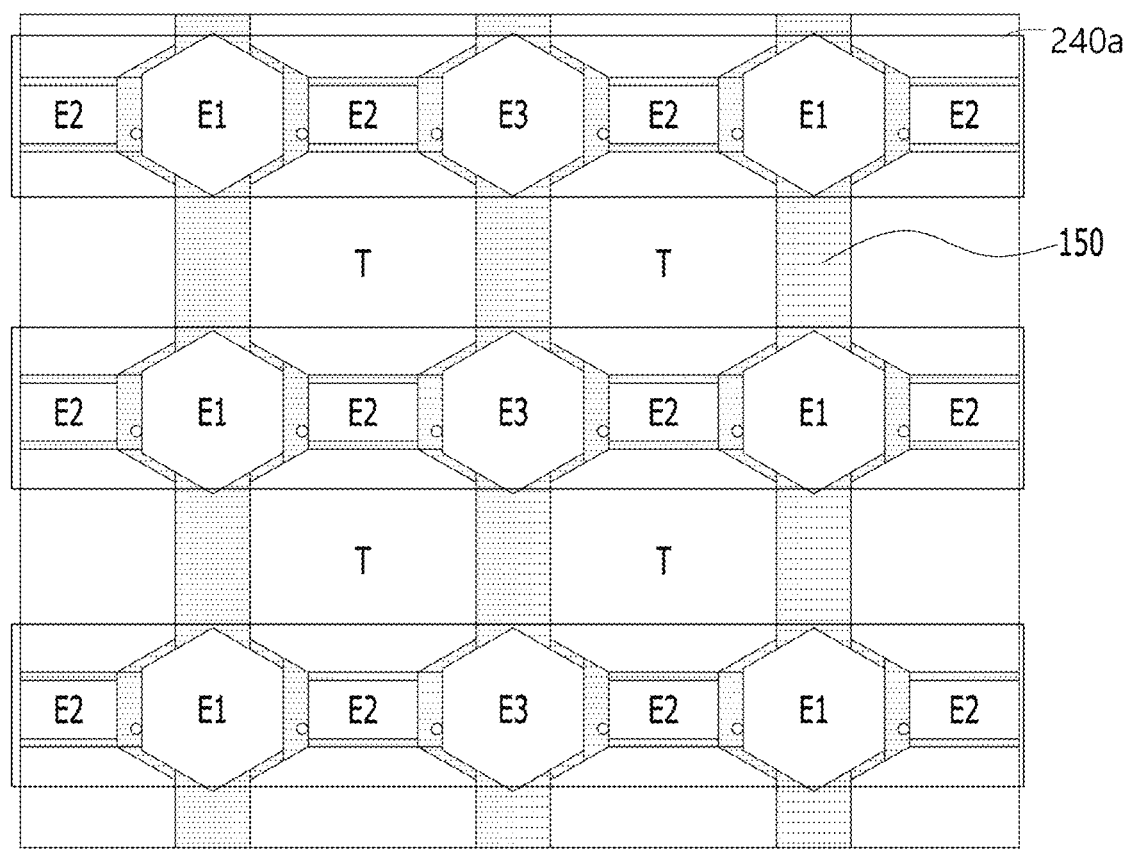
FIG. 17A and FIG. 17B are layouts of modified examples of the third embodiment of the present disclosure.
Figure 17B:
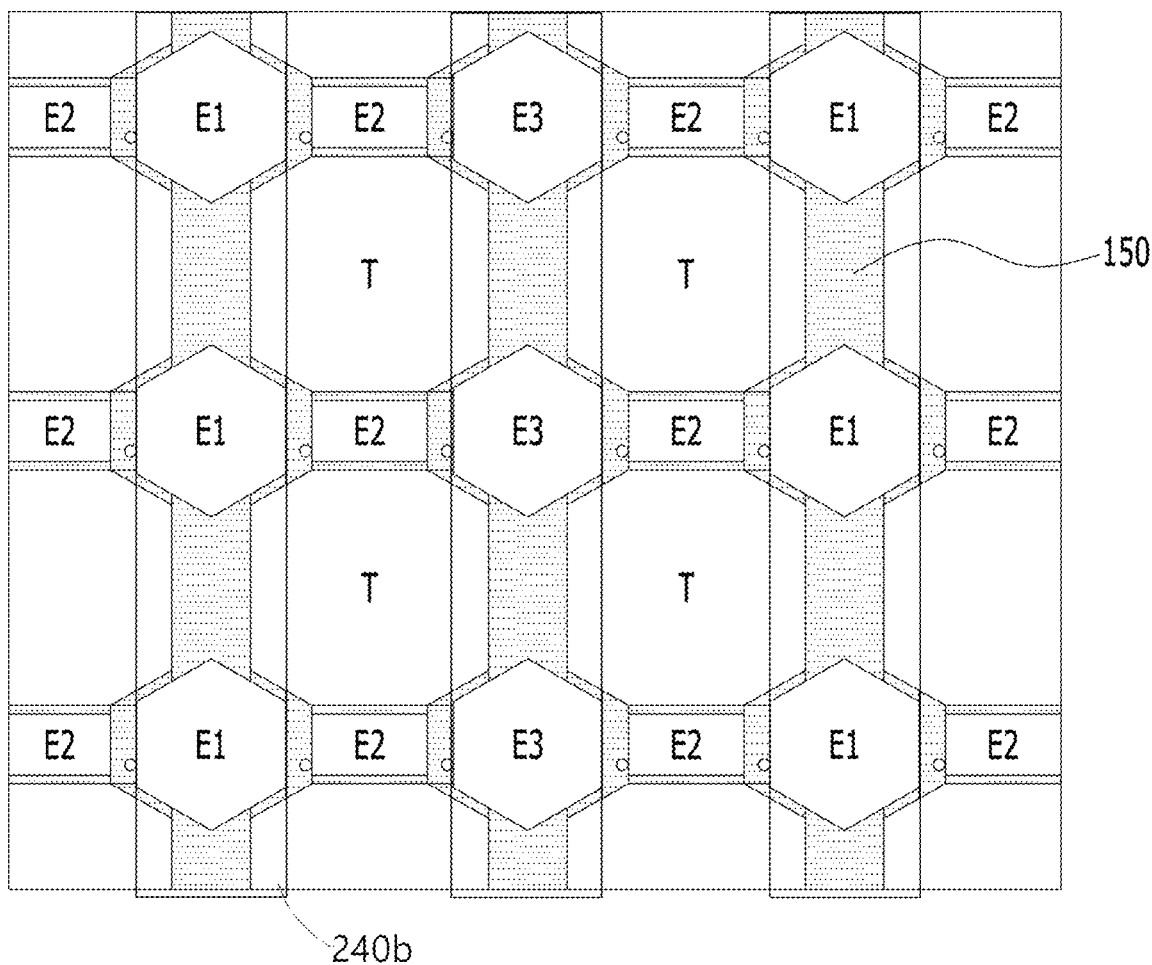

FIG. 16 is a layout showing a display device according to a third embodiment of the present disclosure, and FIG. 17A and FIG. 17B are layouts of modified examples of the third embodiment of the present invention.

Referring to FIG. 16, in a display device according to a third embodiment of the present disclosure, a transmitting part T may be configured in an octagonal shape having 8 sides in a manner that each corner of a virtual rectangular shape of the transmitting part T is cut. A first light emitting part E1 may neighbor to two of four sides inclined to an X-axis and a third light emitting part E3 may neighbor to the rest.

In addition, a second light emitting part E2 may be located between the first and third light emitting parts E1 and E3 in a manner of neighboring to a flat side of the transmitting part T side by side with the X-axis.

The first to third light emitting parts E1, E2 and E3 located around the transmitting part T may emit lights in different colors, respectively. Each of the first and third light emitting parts E1 and E3 has a size relatively greater than that of the second light emitting part E2. If there is a luminous color having a weight in color representation pursued by the display device, each of the first and third light emitting parts E1 and E3 may be provided as a light emitting part in larger size. Each of the first and third light emitting parts E1 and E3 may be hexagonal and the second emitting part E2 may be rectangular.

A bank 150 may be provided between the first to third light emitting parts E1, E2 and E3 and between the transmitting part T and the first to third light emitting parts E1, E2 and E3.

In the third embodiment of the present disclosure, a cathode 240 is provided in a manner of not overlapping with a size of the transmitting part T.

In this case, the cathode 240 may have the same transmittance according to an opening ratio size the transmitting part T has for the substrate 100.

Referring to FIG. 17A and FIG. 17B, display devices according to modified examples of the third embodiment of the present disclosure are illustrated. A cathode 240a/240b is configured to partially overlap with a transmitting part T in X-/Y-axis direction. In this case, a partial width of the transmitting part T is left as an open region in the cathode 240a. The example shown in FIG. 17A shows a bar in which the cathode 240a is formed to extend in an X-axis direction in a manner of having the same length of the first light emitting part E1 or the third light emitting part E3. The example shown in FIG. 17B shows a bar in which the cathode 240b is formed to extend in a Y-axis direction in a manner of having the same width of the first light emitting part E1 or the third light emitting part E3. These are just exemplary, and conductivity of a cathode may be adjusted by controlling an overlapping width between a transmitting part and the cathode.

TABLE 3

| Classification | | Full deposition | | Cathode patterning | | |
|---|---|---|---|---|---|---|
| Electrode structure | Material | AgMg | | Mg:C60 | | |
| | Thickness | 140 Å | 80 Å | 140 Å | | |
| | C60-contained rate | — | — | 5 vol % | | |
| Transmitting part-cathode overlapping rate | | 100% | | 0% | 10% | 20% |
| Transmittance at 550 nm | Panel transparency (opening rate 55%) | 28% | 47% | 55% | 52% | 50% |
| | Panel transparency (opening rate 65%) | 35% | 58% | 65% | 64% | 62% |
| | Device efficiency | 100% | 85% | 100% | 100% | 100% |

Referring to Table 3, in case of an AgMg thin film cathode, since a deposition temperature of Ag is high, as described above, full deposition using an FMM mask is difficult. Hence, as a cathode is fully deposited and overlaps in a transmitting part region, in case that an opening rate of a transmitting part of a panel is 55% or 65%, transmittance of the transmitting part should consider transmittance of a single layer occupied by the cathode on a light path. If the corresponding thickness increases, transparency decreases. On the other hand, in case of a cathode thin layer containing a mixture of fullerene and alkaline earth metal according to the present disclosure, when a cathode does not overlap in a whole region of the transmitting part of the third embodiment shown in FIG. 16, transmittance of the transmitting part may follow the opening rate of the panel transmitting part.

As shown in FIG. 17A or FIG. 17B, in case of overlapping with a predetermined width of the transmitting part in consideration of conductivity of an entire cathode size, as 70% or more of a size of the transmitting part non-overlaps with the cathode, it can be confirmed that panel transparency is high in comparison to a case of overlapping with a whole AgMg cathode thin film. Particularly, since conductivity is improved in case of providing a transmitting part to a cathode in comparison to an AgMg cathode implemented with a thin film in thickness of 80 Å, as shown in FIGS. 16 to 17B, the third embodiment of the present disclosure and the modified examples thereof have the advantages of device efficiency enhancement as well as transparency enhancement.

As shown in FIG. 17A and FIG. 17B, in the modified examples of the third embodiment, when the cathode 240a/240b overlaps with the transmitting part in a manner that a size of the cathode 240a/240b is ¼ or smaller than a total size of the transmitting part on the substrate, the inventors of the present disclosure have confirmed the excellent transparency.

Hereinafter, in a display device according to the present disclosure, an example of applying patterning of a cathode in a different manner is described.

Figure 18:
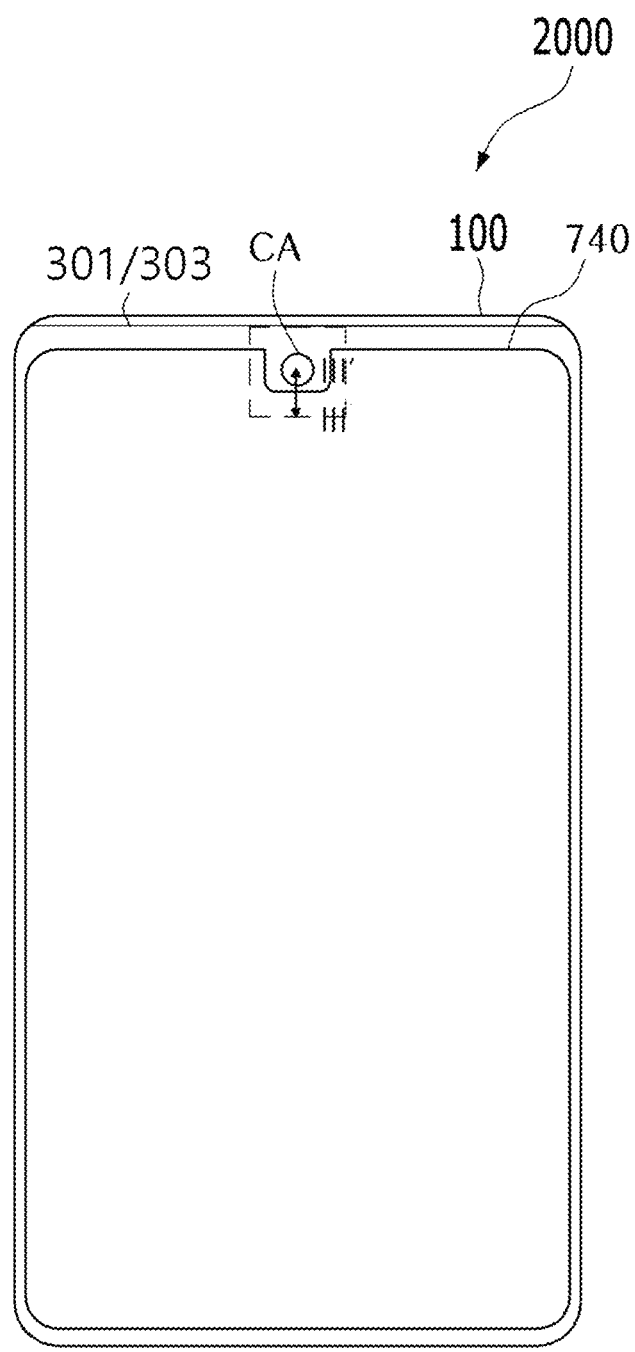
FIG. 18 is a layout showing a display device according to a fourth embodiment of the present disclosure.
Figure 19:
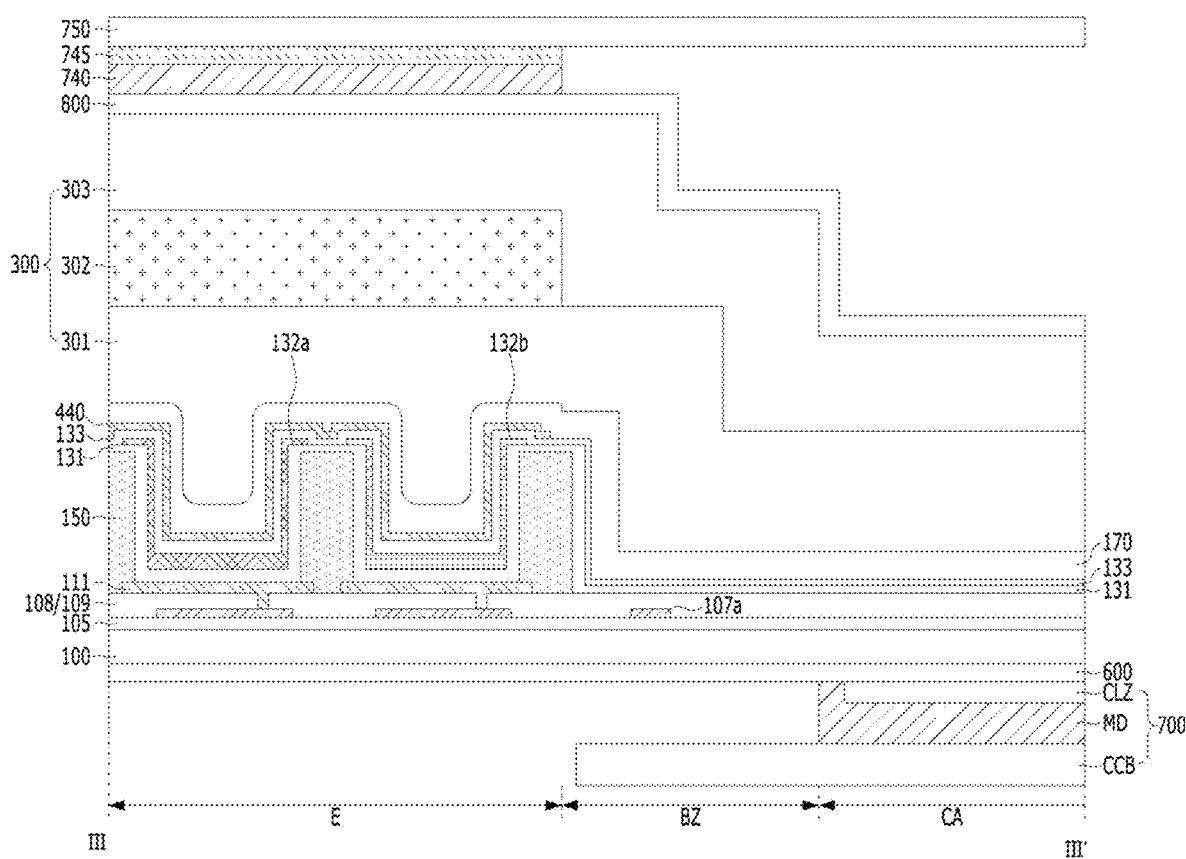
FIG. 19 is a cross-sectional diagram taken along a line III-II' of FIG. 18.

FIG. 18 is a layout showing a display device according to a fourth embodiment of the present disclosure, and FIG. 19 is a cross-sectional diagram taken along a line III-III' of FIG. 18.

Referring to FIG. 18 and FIG. 19, a display device according to a fourth embodiment of the present disclosure shows an example that a camera 700 is located under a substrate 100. In this case, in order to improve a camera recognition rate in a region in which the camera 700 is located, it is intended to omit a configuration of absorbing light from configurations of a camera top.

Namely, to this end, a cathode 440 is patterned in a manner of being spaced apart in a predetermined distance from a camera region CA.

A back plate 660 may be further provided under the substrate 100 for the backside protection.

In the display device according to the fourth embodiment of the present disclosure, the cathode 440 formed from a mixture of fullerene and alkaline earth metal is patternable owing to its low deposition temperature. Moreover, the cathode 440 may be configured in a manner of being spaced apart from the region of the camera 700.

Here, the camera 700 includes a camera lens CLZ, a camera module MD supporting and protecting the camera lens CLZ, and a camera circuit board CCB having the camera module MD mounted thereon.

The camera circuit board CCB may be provided under the back plate 600 by being extended around the camera module MD.

A margin region BZ having a predetermined distance may be provided between the camera region CA and a light emitting part E. A detour wire 107a passing by avoiding the camera region CA may be partially arranged in the margin region BZ.

A buffer layer 105, a thin film transistor TFT and an interlayer insulating layer 108/109 are formed on the substrate 100 of a region corresponding to the light emitting part E, an anode 111 is provided in a manner of being connected to the thin film transistor TFT, and a bank 150 is provided in a manner of overlapping with an edge of the anode 111.

A hole transport layer 131, a light emitting layer 132a/132b, an electron transport layer 133 and a cathode 440 are formed on the anode 111 in turn, thereby configuring a light emitting device (OLED).

Here, the hole transport layer 131 and the electron transport layer 133, which do not use an FMM mask, may be formed in a manner of extending to the margin region BZ and the camera region CA.

As described above, the cathode 440 may be patterned in a manner of being spaced apart from the camera region CA.

A capping layer 170 is formed on the cathode 440, thereby protecting the light emitting device (OLED) and enhancing the light projection characteristics.

A capping layer 170 may be formed to protect the cathode 440 in the margin region BZ.

A structure of an encapsulation layer 300 may be formed on the capping layer 170 in a manner of depositing a first inorganic encapsulation layer 301, an organic encapsulation layer 302 and a second inorganic encapsulation layer 303 in turn.

Here, in the encapsulation layer 300, the organic encapsulation layer 302 may be partially skipped from the bezel region BZ and the camera region CA for the moisture penetration stability of the camera region CA that is thinned.

In this case, as the first and second inorganic encapsulation layers 301 and 303 are formed on the capping layer 170, top and lateral sides of the cathode 440 around the camera region CA may be protected by the capping layer 170, the first inorganic encapsulation layer 301 and the second inorganic encapsulation layer 303.

In some implementations, a protective film 750 may be further provided to a topside of the display device. A polarizing plate 740 is adhered to an inner surface of the protective film 750 through an adhesive layer 745, thereby protecting external light reflection.

A touch function layer or an optical function layer 800 may be further included between the polarizing plate 740 and the second inorganic encapsulation layer 303.

The touch function layer or the optical function layer 800 is formed to cover the camera region CA and the bezel region BZ.

Figure 20:
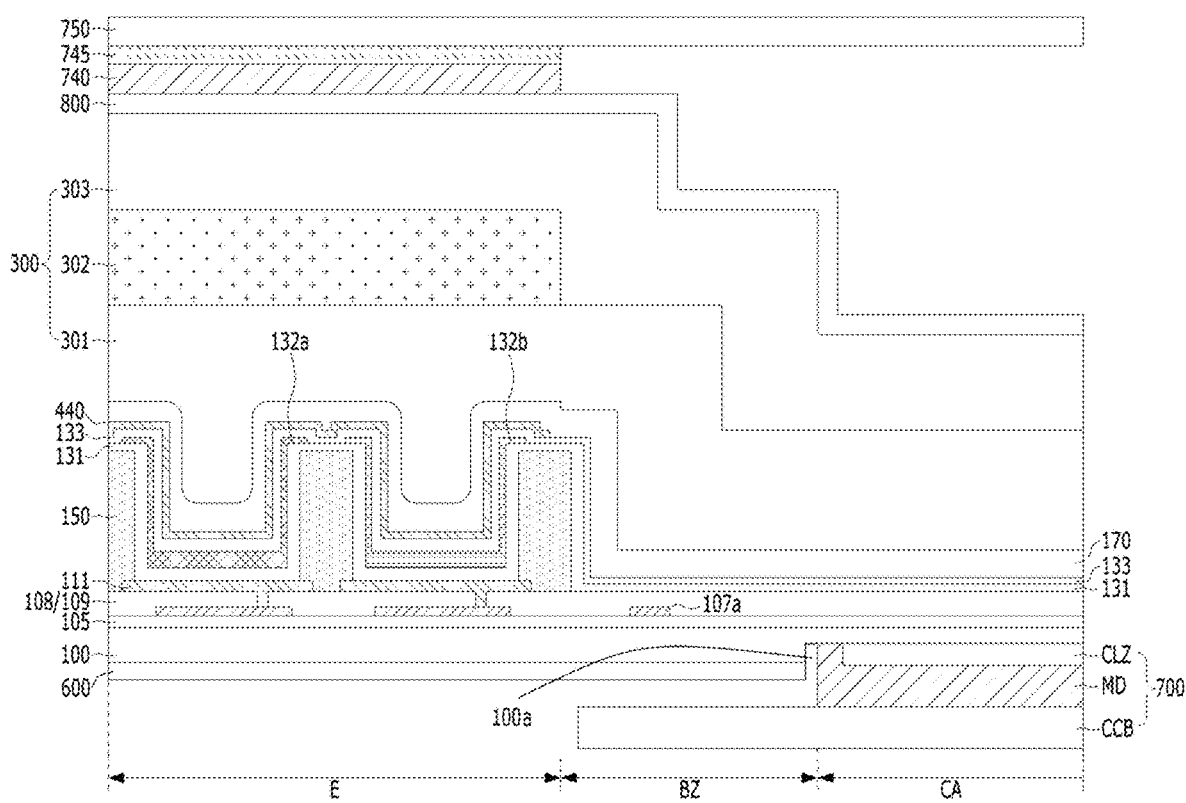
FIG. 20 is a cross-sectional diagram of a display device according to a fifth embodiment of the present disclosure.

FIG. 20 is a cross-sectional diagram of a display device according to a fifth embodiment of the present invention.

In some embodiments, as a modified example of the display device according to the fourth embodiment, a predetermined thickness of the camera 700 may be inserted by removing a partial thickness of the substrate 100.

Referring to FIG. 20, a display device according to a fifth embodiment of the present disclosure is configured in a manner of forming a hole 100a in a substrate 100 and inserting a camera in the hole 100a. The hole 100a is provided to a back plate 600 as well as to the substrate 400. In this case, a cathode 400 is patternable in case of being deposited in a mixture of alkaline earth metal and fullerene.

An electron transport layer 133 and a hole transport layer 131, which are the elements of a light emitting device under the cathode, may be omitted from a camera region CA and a bezel region BZ to prevent the risk of moisture penetration from the exposure in the camera region CA.

Hereinafter, in a display device of the present disclosure, transmittance for visible ray wavelengths depending on presence or non-presence of a cathode in a transmitting part is described.

TABLE 4

| Presence or non-presence of a cathode in a transmitting part | | Transmittance (%) | | | Stacked structure |
| --- | --- | --- | --- | --- | --- |
| | | 430 nm | 550 nm | 620 nm | |
| Non-presence | Single layer transmittance | 107.6 | 107.2 | 108.0 | OLED/CPL |
| | Transmitting part transmittance | 97.6 | 97.2 | 98.0 | OLED/CPL/Encap |
| Presence (AgMg 140 Å) | Single layer transmittance | 75.7 | 75.8 | 63.2 | OLED/CPL |
| | Transmitting part transmittance | 65.7 | 65.8 | 53.2 | OLED/CPL/Encap |

Figure 21:
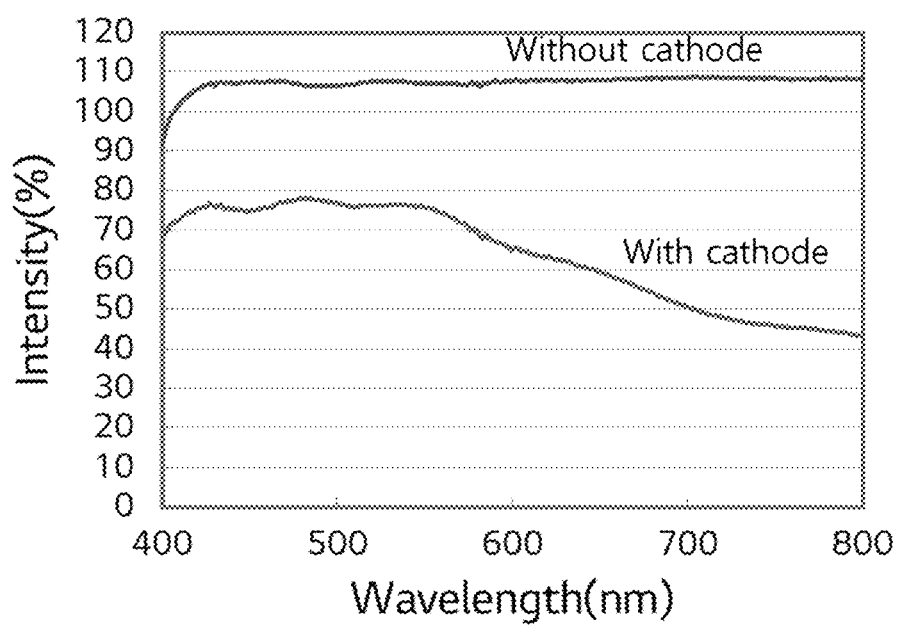
FIG. 21 is a graph showing transmittance over visible light wavelengths of a transmitting part depending on presence or non-presence of the cathode.

FIG. 21 is a graph showing transmittance over visible light wavelengths of a transmitting part depending on presence or non-presence of a cathode.

In Table 4, when a cathode is removed from a transmitting part, transmittance increases by 30% or more through all wavelengths of visible light. Since the transmittance increases up to 97% with reference to the transmitting part transmittance and high transmittance is maintained through all wavelength bands, as shown in FIG. 21, there is almost no transmittance difference per wavelength, whereby color shift can be prevented advantageously.

As mentioned in the foregoing description, when a mixture of alkaline earth metal and fullerene is applied as a cathode of the present disclosure, patterning is facilitated to enable the implementation of high transmittance and a stable operation of a light emitting device.

In addition, when alkaline earth metal and fullerene are mixed together, the inventors of the present disclosure confirmed that formation of an oxide layer by the reaction between single-layered alkaline earth metal and oxygen was reduced.

After a single Mg layer and a layer of mixed Mg and fullerene $C_{60}$ have been formed respectively, binding energy of each of the layers is measured. In the single Mg layer, it is confirmed that an MgO peak becomes main. Yet, in the layer of mixed Mg and fullerene $C_{60}$, it is confirmed that a peak of pure Mg is dominant, whereby oxidation resistant is increased.

Moreover, since a cathode needs to be implemented as a thin film to maintain transmission capability, transition metals such as Ag causes a problem that an aggregation effect is generated from forming a single layer, whereby surface characteristic becomes irregular. Thus, it is difficult to directly apply such a cathode to a display device.

In order to secure both high transmittance and low resistivity for a cathode, a display device of the present disclosure is formed to have a cathode 140 with a mixture of some carbon atoms of fullerene and alkaline earth metal instead of a single metal material, and more particularly, uses the advantage that transmitting part patterning is possible owing to the low deposition temperatures of these materials.

Accordingly, a display device and method for manufacturing the same according to the present disclosure has the following effects and/or advantages.

Firstly, a cathode is formed with a mixture comprising alkaline earth metal and fullerene or a mixture comprising alkaline earth metal and fullerene derivatives. In this case, since a deposition temperature is low, cathode deposition is possible at the heat-resisting temperature of an FMM mask, thereby forming a cathode that is patternable in the course of deposition.

Secondly, when a cathode is formed with a mixture comprising or containing alkaline earth metal and fullerene or a mixture comprising or containing alkaline earth metal and fullerene derivatives, since a deposition temperature is as low as a temperature for depositing a light-emitting layer or a common layer, a deposition chamber is usable in common and processability securement is facilitated.

Thirdly, a mixture of alkaline earth metal and fullerene gives oxidation resistant to the alkaline earth metal, high-temperature high-humidity reliability of a cathode can be enhanced.

Fourthly, since a cathode can be formed not on a transmitting part through forming a patterned cathode, transmittance of the transmitting part can be improved, which is advantageously applicable to a transparent display device.

Fifthly, as a cathode having a selective overlapping portion is provided to a transmitting part, transmission efficiency of a panel can be controlled. In this case, since the cathode may have low resistivity by a region overlapping with the transmitting part, voltage drop of the cathode can be prevented and transmission efficiency can be improved.

Sixthly, when an n-type of high electron mobility fullerene is used as a fullerene isomer, as electron injectability is improved, efficiency improvement is expected.

To this end, a display device according to one embodiment of the present disclosure may include an anode at each of a plurality of light emitting parts of a substrate, a light emitting layer provided over the anode each, and a cathode over the light emitting layer to overlap a plurality of the light emitting parts of the substrate, the cathode comprising alkaline earth metal and fullerene complexed with the alkaline earth metal.

The substrate further includes a transmitting part between a plurality of the light emitting parts and the cathode may include a region non-overlapping with the transmitting part.

The cathode may overlap the transmitting part by a size equal to or smaller than ¼ of a total size of the transmitting part in the substrate.

The display device may further comprise a camera under the substrate to correspond to a portion of a region of the transmitting part.

The cathode may be spaced apart from a camera corresponding region of the substrate in a predetermined distance.

The fullerene may include a carbon aggregate having a number of carbon atoms of 20 or more.

The fullerene may have a spherical or elliptical shape.

The alkaline earth metal is located within the spherical or elliptical shape and may form a complex with one or more carbon atoms of the fullerene.

The alkaline earth metal is located outside the fullerene and may form a complex with the one or more carbon atoms of the fullerene.

The fullerene of the cathode may be contained in the cathode under 10 vol %.

The display device may further comprise an electron injection layer between the light emitting layer and the cathode, and the electron injection layer may comprise or contain lanthanum metal.

The alkaline earth metal may include at least one of Mg, Ca, Be, Sr, Ba and Ra.

The display device may further comprise a capping layer and an encapsulation layer over the cathode.

The substrate may include a hole and the cathode may be spaced apart from the hole in a predetermined distance.

A capping layer and an inorganic encapsulation layer may be sequentially provided at top and lateral sides of the cathode which is spaced apart from the hole.

The alkaline earth metal and the fullerene may be co-deposited in a manner of being included as a mixture in the same source.

The content of alkaline earth metal may be greater than the fullerene.

A ratio of the alkaline earth metal to the fullerene may be 10:1 to 20:1.

The alkaline earth metal may combine with one or more carbon atoms of the fullerene derivative.

The fullerene of the cathode may be contained in the cathode above 1 vol %.

The light emitting layer corresponding to each light emitting part between the anode and the cathode may differ from each other in thickness.

A method of manufacturing a display device according to one embodiment of the present disclosure may include the steps of providing an anode at each of a plurality of light emitting parts of a substrate, providing a light emitting layer over the anode, and providing a cathode by depositing a mixture of alkaline earth metal and fullerene over the substrate including the light emitting layer.

The method may further include the step of providing a bank overlapping with an edge of the anode after the step of providing the anode.

In the step of providing the bank, a first open region may be defined as the light emitting part and a second open region may be defined as a transmitting part.

The step of providing the cathode may include the step of using a deposition mask having a shield part corresponding to the transmitting part.

The method may further include the step of providing a camera under the substrate.

The step of providing the cathode may include the step of performing patterning to have a spaced distance from the camera.

The substrate may comprise a hole to insert a camera.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present invention. Accordingly, various embodiments disclosed in the present disclosure are not intended to limit the technical sprit of the present disclosure, and the scope of the technical sprit of the present disclosure is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a substrate comprising a plurality of light emitting parts and a transmitting part between a plurality of the light emitting parts;
    an anode at each of the plurality of light emitting parts;
    a light emitting layer over the anode; and
    a cathode over the light emitting layer to overlap the plurality of the light emitting parts of the substrate, the cathode comprising an alkaline earth metal and a fullerene or fullerene derivative complexed with the alkaline earth metal,
    wherein the cathode includes a region non-overlapping with the transmitting part.

2. The display device of claim 1, wherein the cathode overlaps the transmitting part by a size equal to or smaller than ¼ of a total size of the transmitting part in the substrate.

3. The display device of claim 1, further comprising a camera under the substrate corresponding to a portion of a region of the transmitting part.

4. The display device of claim 3, wherein the cathode is spaced apart from a camera corresponding region of the substrate.

5. The display device of claim 1, wherein the fullerene or fullerene derivative comprises a carbon aggregate having a number of carbon atoms of 20 or more.

6. The display device of claim 1, wherein the fullerene or fullerene derivative has a spherical or elliptical shape.

7. The display device of claim 6, wherein the alkaline earth metal is located within the spherical or elliptical shape and complexes with one or more carbon atoms of the fullerene or fullerene derivative.

8. The display device of claim 1, wherein the alkaline earth metal is located outside the fullerene and complexes with one or more carbon atoms of the fullerene or fullerene derivative.

9. The display device of claim 1, wherein a content of the fullerene or fullerene derivative in the cathode is under 10 vol % with respect to a total volume of the cathode.

10. The display device of claim 1, further comprising an electron injection layer between the light emitting layer and the cathode, wherein the electron injection layer includes a lanthanum metal.

11. The display device of claim 1, wherein the alkaline earth metal comprises Mg, Ca, Be, Sr, Ba, Ra or combinations thereof.

12. The display device of claim 1, further comprising a capping layer and an encapsulation layer over the cathode.

13. The display device of claim 1, wherein the substrate includes a hole, wherein the cathode is spaced apart from the hole.

14. The display device of claim 13, wherein a capping layer and an inorganic encapsulation layer are sequentially provided at top and lateral sides of the cathode.

* * * * *